(12) United States Patent
Lim et al.

(10) Patent No.: US 10,050,129 B2
(45) Date of Patent: Aug. 14, 2018

(54) METHOD OF FORMING FINE PATTERNS

(71) Applicant: Samsung Electronics Co., Ltd., Suwon-si, Gyeonggi-do (KR)

(72) Inventors: Jung-Bum Lim, Yongin-si (KR); Jong-Ryul Jun, Yongin-si (KR); Eun-A Kim, Seoul (KR); Jong-Min Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/437,563

(22) Filed: Feb. 21, 2017

(65) Prior Publication Data
US 2017/0256628 A1    Sep. 7, 2017

(30) Foreign Application Priority Data

Mar. 3, 2016 (KR) .......................... 10-2016-0025528

(51) Int. Cl.
| | |
|---|---|
| *H01L 21/336* | (2006.01) |
| *H01L 29/66* | (2006.01) |
| *H01L 21/768* | (2006.01) |
| *H01L 21/306* | (2006.01) |
| *H01L 21/027* | (2006.01) |

(52) U.S. Cl.
CPC .... *H01L 29/66795* (2013.01); *H01L 21/0274* (2013.01); *H01L 21/30604* (2013.01); *H01L 21/76895* (2013.01); *H01L 29/66621* (2013.01)

(58) Field of Classification Search
CPC ............ H01L 29/6656; H01L 21/0274; H01L 21/30604; H01L 21/76895; H01L 29/66545; H01L 29/66795
See application file for complete search history.

(56) References Cited

U.S. PATENT DOCUMENTS

| | | | |
|---|---|---|---|
| 7,776,750 B2 | 8/2010 | Kim | |
| 8,603,919 B2 | 12/2013 | Han | |
| 8,614,148 B2 | 12/2013 | Park et al. | |
| 8,785,319 B2 | 7/2014 | Park et al. | |

(Continued)

FOREIGN PATENT DOCUMENTS

| | | |
|---|---|---|
| JP | 2002-050566 | 2/2002 |
| KR | 2010-0102422 A | 9/2010 |
| KR | 2010-0134418 A | 12/2010 |

(Continued)

*Primary Examiner* — Syed Gheyas
(74) *Attorney, Agent, or Firm* — Harness, Dickey & Pierce, P.L.C.

(57) ABSTRACT

A method of forming fine patterns including forming a plurality of first sacrificial patterns on a target layer, the target layer on a substrate, forming first spacers on respective sidewalls of the first sacrificial patterns, removing the first sacrificial patterns, forming a plurality of second sacrificial patterns, the second sacrificial patterns intersecting with the first spacers, each of the second sacrificial patterns including a line portion and a tab portion, and the tab portion having a width wider than the line portion, forming second spacers on respective sidewalls of the second sacrificial patterns, removing the second sacrificial patterns, and etching the target layer through hole regions, the hole regions defined by the first spacers and the second spacers, to expose the substrate may be provided.

20 Claims, 30 Drawing Sheets

(56) References Cited

U.S. PATENT DOCUMENTS

2013/0264622 A1* 10/2013 Lin .................. H01L 27/115
257/314
2014/0322915 A1   10/2014 Lee et al.

FOREIGN PATENT DOCUMENTS

| KR | 2013-0109829 A | 10/2013 |
| KR | 2014-0028722 A | 3/2014 |
| KR | 2015-0049506 A | 5/2015 |

* cited by examiner

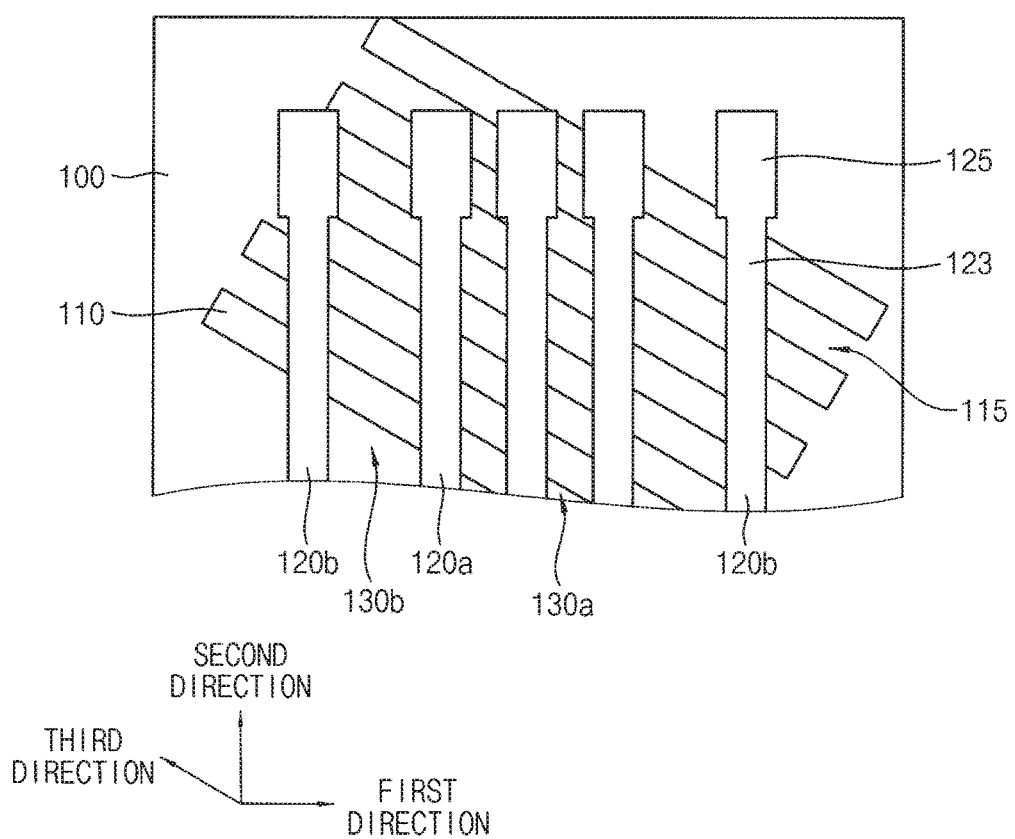

270  260  255 260

SECOND
DIRECTION

THIRD
DIRECTION

FIRST
DIRECTION

METHOD OF FORMING FINE PATTERNS

CROSS-RELATED APPLICATION

This application claims priority under 35 USC § 119 to Korean Patent Application No. 10-2016-0025528, filed on Mar. 3, 2016 in the Korean Intellectual Property Office (KIPO), the contents of which are herein incorporated by reference in their entirety.

BACKGROUND

1. Field

Example embodiments relate to photomask layouts, methods of forming fine patterns, and/or methods of manufacturing semiconductor devices. More particularly, example embodiments relate to photomask layouts used for forming a fine hole, methods of forming fine patterns using the photomask layout, and/or methods of manufacturing semiconductor devices using the photomask layout.

2. Description of the Related Art

A photolithography process may be used to define elements such as a wiring, a plug, and/or a contact for implementing circuits of a semiconductor device, etc. In the photolithography process, a photomask layout in which a circuit pattern is preliminarily designed may be manufactured. A photoresist film may be patterned to form a photoresist pattern using the photomask layout. A conductive layer may be patterned to form the circuit pattern using the photoresist pattern as an etch mask.

As the semiconductor device becomes highly integrated, a critical dimension of a target pattern may be reduced. Thus, improved exposure equipment or a fine etching process such as a double patterning process may be desired. The double patterning process refers to a patterning, which defines a pattern by providing sacrificial structures, forming spacers on sidewalls of the sacrificial structures, and removing the sacrificial structures between the spacers.

SUMMARY

Some example embodiments provide photomask layouts that are capable of forming a pattern having a higher resolution.

Some example embodiments provide methods of forming fine patterns having a higher resolution and higher reliability.

Some example embodiments provide methods of manufacturing semiconductor devices having a higher resolution and higher reliability.

According to an example embodiment, a method of forming fine patterns includes forming a plurality of first sacrificial patterns on a target layer, the target layer on a substrate, forming first spacers on respective sidewalls of the first sacrificial patterns, removing the first sacrificial patterns, forming a plurality of second sacrificial patterns, the second sacrificial patterns intersecting with the first spacers, each of the second sacrificial patterns including a line portion and a tab portion, and the tab portion having a width wider than the line portion, forming second spacers on respective sidewalls of the second sacrificial patterns, removing the second sacrificial patterns, and etching the target layer through hole regions, the hole regions defined by the first spacers and the second spacers, to expose the substrate.

According to an example embodiment, a method of forming fine patterns includes forming a target layer on a substrate, the substrate having a cell region and a dummy region, forming first spacers on the target layer by a first double patterning process, the first spacers extending in a first direction, forming second spacers extending in a second direction by a second double patterning process, the first direction being oblique to the second direction, the second spacers intersecting with the first spacers, and gaps between the second spacers increasing and decreasing alternately in the dummy region in the first direction, and etching the target layer through spaces defined by the first spacers and the second spacers to form contact holes.

According to an example embodiment, a method of forming fine patterns includes forming an isolation layer on a substrate to define active patterns, forming gate structures on the active patterns and the isolation layer, forming source/drain regions on the active patterns, the source/drain regions adjacent to the gate structures, forming an insulating interlayer on the active patterns and the isolation layer to cover the gate structures and the source/drain regions, forming a plurality of first sacrificial patterns on the insulating interlayer, forming first spacers on sidewalls of the first sacrificial patterns, removing the first sacrificial patterns, forming a plurality of second sacrificial patterns, the second sacrificial patterns intersecting with the first spacers, each of the second sacrificial patterns including a line portion and a tab portion, and the tab portion having a width wider than the line portion, forming second spacers on sidewalls of the second sacrificial patterns, removing the second sacrificial patterns, and partially removing the insulating interlayer through hole regions, the hole regions defined by the first spacers and the second spacers, to form contact holes exposing the source/drain regions.

According to an example embodiment, a photomask layout includes a plurality of first pattern regions extending in a first direction, and a plurality of second pattern regions intersecting with the first pattern regions, the second pattern regions extending in a second direction, the first direction being oblique to the second direction, each of the second pattern regions including a line region and a tab region connected with an end of the line region, and the tab region having a width greater than the line region.

According to an example embodiment, a method of forming fine patterns includes forming a target layer on a substrate, the substrate having a cell region and a dummy region, forming first spacers on the target layer by a first patterning process, the first spacers extending in a first direction, forming second spacers extending in a second direction by a second patterning process, the first direction being oblique to the second direction, the second spacers intersecting with the first spacers, and gaps between the second spacers increasing and decreasing alternately in the dummy region in the first direction, and etching the target layer through spaces defined by the first spacers and the second spacers to form contact holes.

BRIEF DESCRIPTION OF THE DRAWINGS

Example embodiments will be more clearly understood from the following detailed description taken in conjunction with the accompanying drawings. FIGS. 1 to 37 represent non-limiting, example embodiments as described herein.

FIGS. 1A and 1B are plan views illustrating photomask layouts in accordance with some example embodiments;

FIGS. 2 to 21 are plan views and cross-sectional views illustrating a method of forming fine patterns in accordance with an example embodiment;

FIGS. 22 to 24 are plan views illustrating a method of forming fine patterns in accordance with an example embodiment;

FIGS. 25 and 26 are plan views illustrating methods of forming fine patterns in accordance with some comparative examples; and FIGS. 27 to 37 are plan views and cross-sectional views illustrating a method of manufacturing semiconductor devices in accordance with an example embodiment.

DETAILED DESCRIPTION

Hereinafter, some example embodiments will be explained in detail with reference to the accompanying drawings.

Figure 1A:
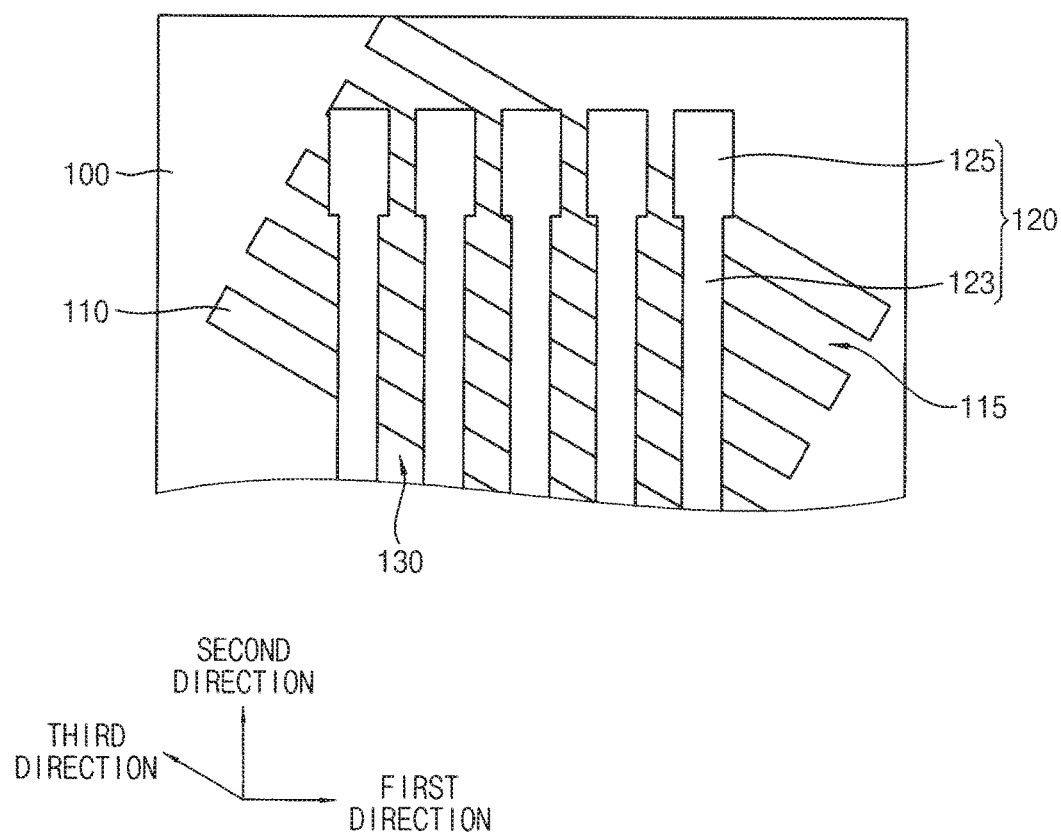

FIGS. 1A and 1B are plan views illustrating photomask layouts in accordance with some example embodiments.

In FIGS. 1A and 1B, a first direction and a second direction may define two directions substantially perpendicular to each other. A third direction may define an oblique direction with respect to the first direction or the second direction.

Referring to FIG. 1A, a photomask layout may include a blank region 100, a first pattern region 110 and a second pattern region 120.

The blank region 100 may correspond to a layer, a mask layer or a sacrificial layer on which an exposure process may be performed.

The first pattern region 110 may be extended in the oblique direction. For example, the first pattern region 110 may be extended in the third direction. A plurality of the first pattern region 110 may be arranged in a direction substantially perpendicular to the third direction.

First spaces 115 may be defined between the first pattern regions 110. Thus, the first spaces 115 may be extended in the third direction. In some example embodiments, each of the first spaces 115 may have a width in the direction substantially perpendicular to the third direction.

In some example embodiments, the first pattern region 110 may correspond to a first double patterning technology (DPT) pattern for a first double patterning process.

The second pattern region 120 may be extended in a straight direction. For example, the second pattern region 120 may be extended in the second direction. The second pattern region 120 may be placed over the first pattern region 110. The second pattern region 120 may be intersected with the first pattern regions 110. Further, a plurality of the second pattern regions 120 may be arranged in the first direction.

Second spaces 130 may be defined between the second pattern regions 120. Thus, the second spaces 130 may be extended in the second direction. In some example embodiments, each of the second spaces 130 may have a width in the first direction.

In some example embodiments, the second pattern region 120 may include a line region 123 and a tab region 125. The tab region 125 may be connected to an end of the line region 123. The tab region 125 may have a width in the first direction greater than a width of the line region 123 in the first direction.

The second spacer 130 between the adjacent tab regions 125 may have a width less than a width of the second spacer 130 between the adjacent line regions 123. Thus, an area of the blank region 100 exposed through portions of the adjacent tab regions 125 may be smaller than an area of the blank region 100 exposed through portions of the adjacent line regions 123.

In some example embodiments, the tab region 125 may be connected to one end of the line region 123 in FIG. 1A. In some example embodiments, the two tab regions 125 may be connected to both ends of the line region 123.

Referring to FIG. 1B, gaps between the second patterns regions 120 may be different from each other. For example, a gap between a central second pattern region and an edge second pattern region may be wider than a gap between the central second pattern regions. For example, the second pattern region 120 may include a cell pattern region 120a (e.g., the central second pattern region) and the dummy pattern region 120b (e.g., the edge second pattern region).

The cell pattern regions 120a may be arranged in a region corresponding to a cell region or a cell block of a semiconductor device. The dummy pattern region 120b may be arranged in a boundary region or a peripheral region of the cell region or the cell block. The two dummy pattern regions 120b may be arranged at both sides of the cell pattern regions 120a, respectively.

In some example embodiments, a second space 130b between the cell pattern region 120a and the dummy pattern region 120b may have a width greater than a width of a second space 130a between the cell pattern regions 120a.

As mentioned with reference to FIG. 1A, the cell pattern regions 120a and the dummy pattern regions 120b may be extended in the second direction. Each of the cell pattern regions 120a and the dummy pattern regions 120b may include the line region 123 and the tab region 125.

Figure 20:
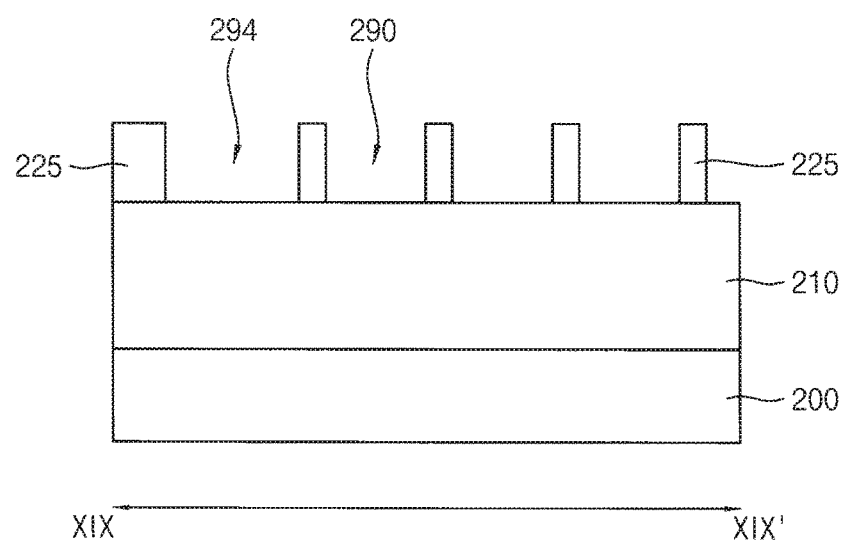
Figure 21:
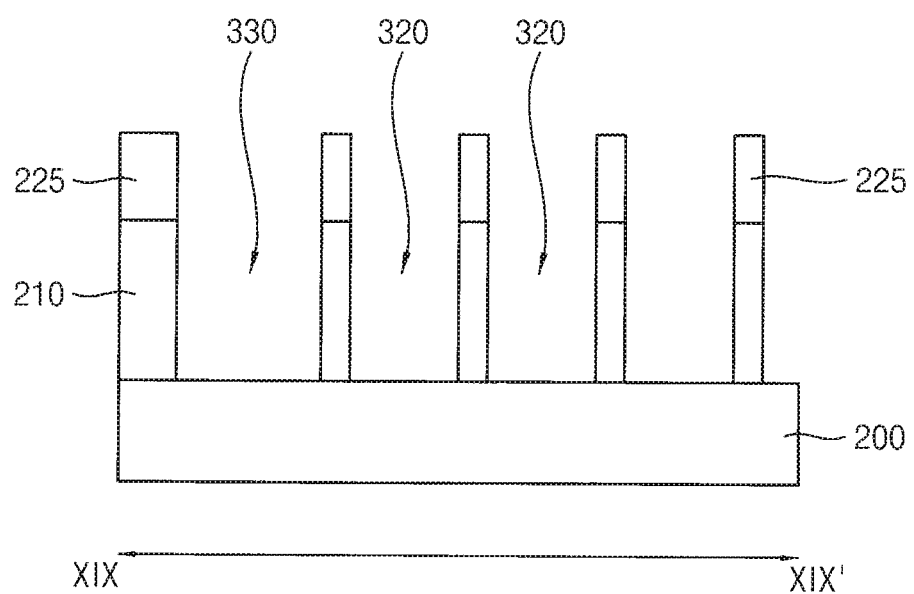

FIGS. 2 to 21 are plan views and cross-sectional views illustrating a method of forming fine patterns in accordance with an example embodiment. FIGS. 2, 4, 6, 8, 10, 12, and 14-18 are plan views illustrating the methods of forming fine patterns. FIG. 3, is a cross-sectional views taken along line III-III' in FIG. 2. FIG. 5 is a cross-sectional views taken along line V-V' in FIG. 4. FIG. 7 is a cross-sectional views taken along line VII-VII' in FIG. 8. FIG. 9 is a cross-sectional views taken along line IX-IX' in FIG. 8. FIG. 11 is a cross-sectional views taken along line XI-XI' in FIG. 10. FIG. 13 is a cross-sectional views taken along line XIII-XIII' in FIG. 12. FIGS. 19 to 21 are cross-sectional views taken along line XIX-XIX' in FIG. 18.

In FIGS. 2 to 21, a first direction and a second direction may define two directions substantially perpendicular to each other. A third direction may define an oblique direction with respect to the first direction or the second direction.

Figure 2:
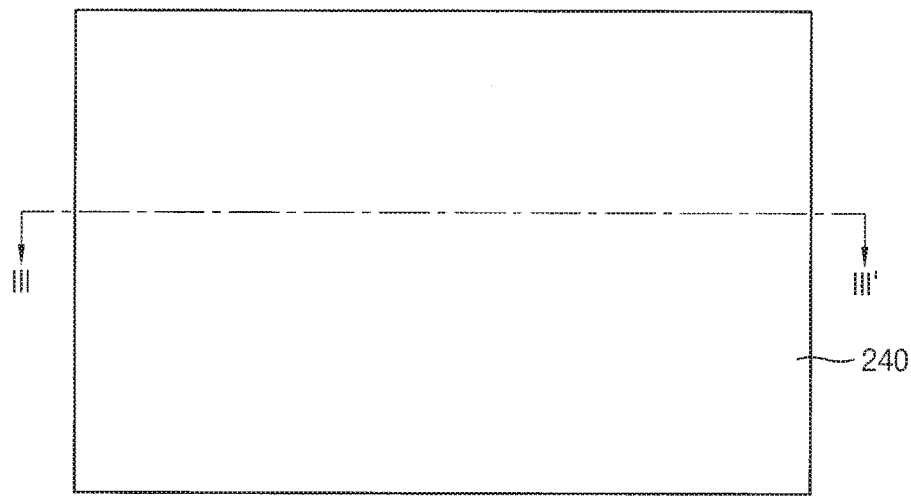
Figure 2:
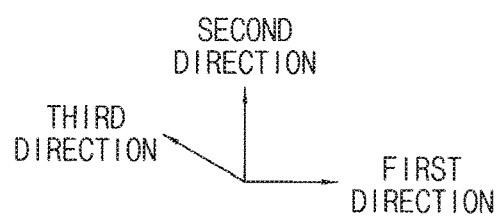
Figure 3:
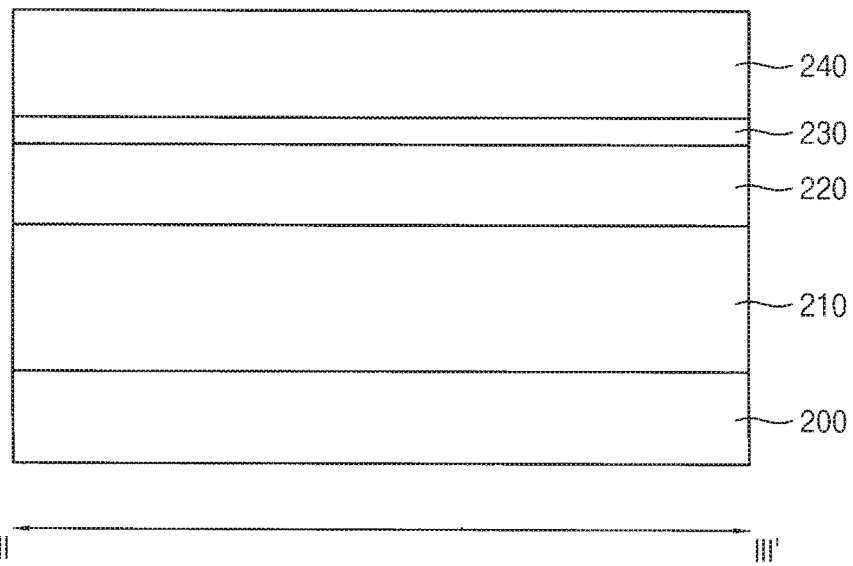

Referring to FIGS. 2 and 3, a target layer 210, a mask layer 220, a buffer layer 230 and a first sacrificial layer 240 may be sequentially formed on an upper surface of a substrate 200.

In some example embodiments, the substrate 200 may include a semiconductor substrate such as a silicon substrate, a germanium substrate, a silicon-germanium substrate, a silicon-on-insulator (SOI) substrate, a germanium-on-insulator (GOI) substrate, etc. The substrate 200 may include a III-V compound such as InP, GaP, GaAs, GaSb, etc. Although not depicted in drawings, a circuit structure such as a gate structure, impurity regions, a wiring, a plug, etc., may be formed on the substrate 200.

The target layer 210 may be converted into a fine pattern by a double patterning process. For example, the target layer 210 may be partially etched by the double patterning process to form the fine pattern having holes.

The target layer 210 may be configured to at least partially cover the circuit structure. In some example embodiments, the target layer 210 may include silicon oxide (e.g., plasma enhanced oxide (PEOX), tetraethyl orthosilicate (TEOS), or silicate glass). The target layer 210 may be organic oxide having a low dielectric, for example, polysiloxane or silsesquioxane.

The target layer 210 may be formed by, for example, a chemical vapor deposition (CVD) process, a physical vapor deposition (PVD) process, an atomic layer deposition (ALD) process, or a spin coating process.

The mask layer 220 may be formed on an upper surface of the target layer 210. The mask layer 220 may be converted into a mask pattern by the double patterning process. The mask pattern may be used for etching the target layer 210.

In some example embodiments, the mask layer 220 may be formed by, for example, a spin coating process using a silicon-based or carbon-based spin-on hard mask material (SOH).

The buffer layer 230 may be formed on an upper surface of the mask layer 220. The buffer layer 230 may function as an etch stop layer. For example, the buffer layer 230 may be silicon oxynitride or silicon nitride formed by a sputtering process or an ALD process.

The first sacrificial layer 240 may be formed on an upper surface of the buffer layer 230. The first sacrificial layer 240 may correspond to a target layer of a first double patterning process. The first sacrificial layer 240 may be formed by, for example, a spin coating process using an SOH.

Figure 4:
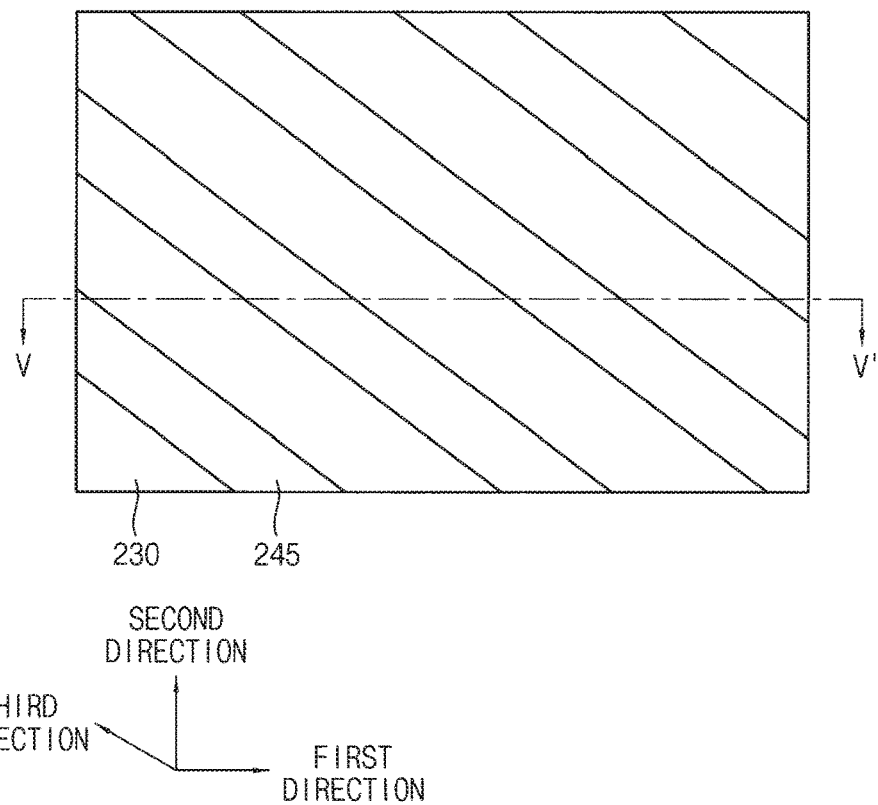
Figure 5:
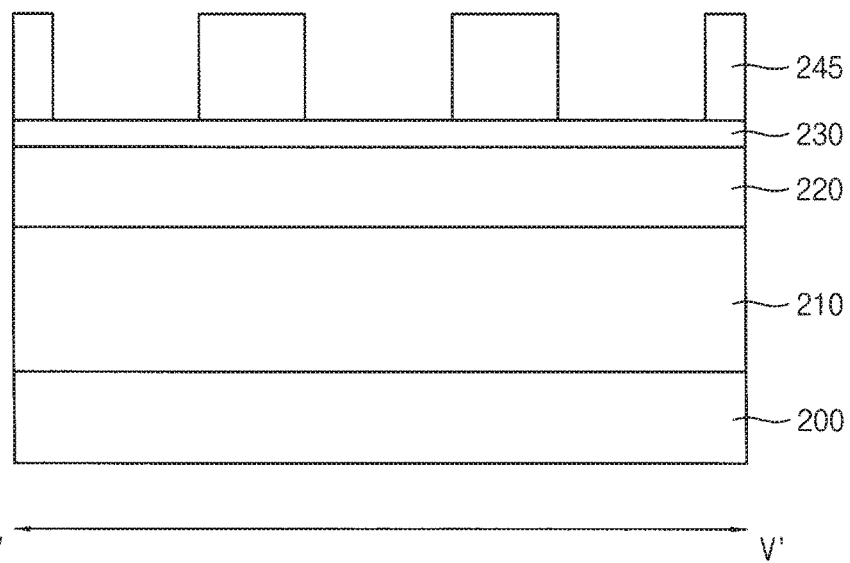

Referring to FIGS. 4 and 5, the first sacrificial layer 240 may be patterned to form a first sacrificial pattern 245.

In some example embodiments, the first sacrificial pattern 245 may be formed by transcribing the first pattern region 110 of the photomask layout in FIG. 1A or 1B into the first sacrificial layer 240.

For example, a first photoresist film (not shown) may be formed on an upper surface of the first sacrificial layer 240. A first exposure process using the first pattern region 110 of the photomask layout may be performed on the first photoresist film to form a first photoresist pattern. The first sacrificial layer 240 may be patterned using the first photoresist pattern as an etch mask to form the first sacrificial pattern 245. After forming the first sacrificial pattern 245, the first photoresist pattern may then be removed by a strip process.

In some example embodiments, the first sacrificial pattern 245 may be extended in an oblique direction, for example, the third direction. A plurality of the first sacrificial patterns 245 may be arranged in a direction substantially perpendicular to the third direction. The upper surface of the buffer layer 230 may be partially exposed through gaps between the first sacrificial patterns 245. The first sacrificial patterns 245 may be parallel to the upper surface of the target layer.

Figure 6:
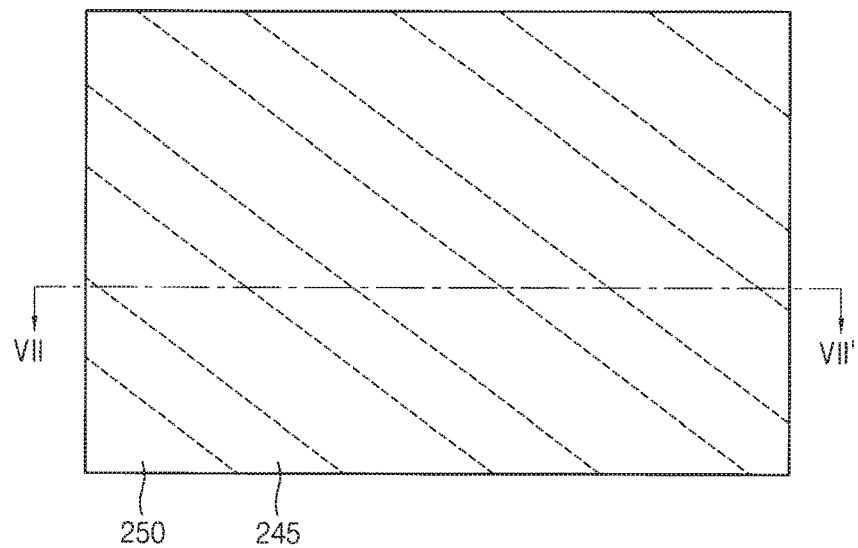
Figure 7:
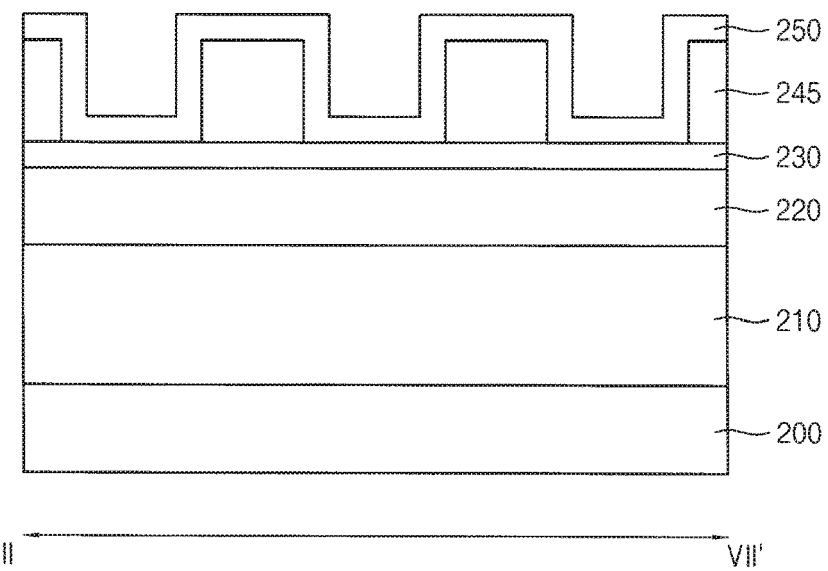

Referring to FIGS. 6 and 7, a first spacer layer 250 may be formed on an upper surface of the first sacrificial pattern 25 and the exposed upper surface of the buffer layer 230.

The first spacer layer 250 may include a material having good step coverage or conformal characteristic. The first spacer layer 250 may include an ALD oxide.

Figure 8:
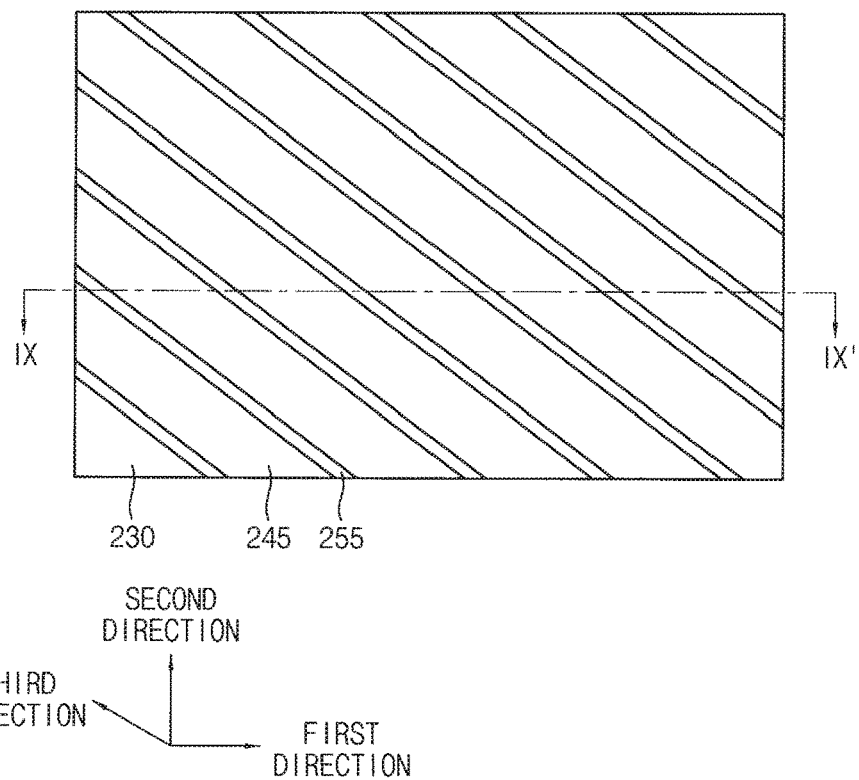
Figure 9:
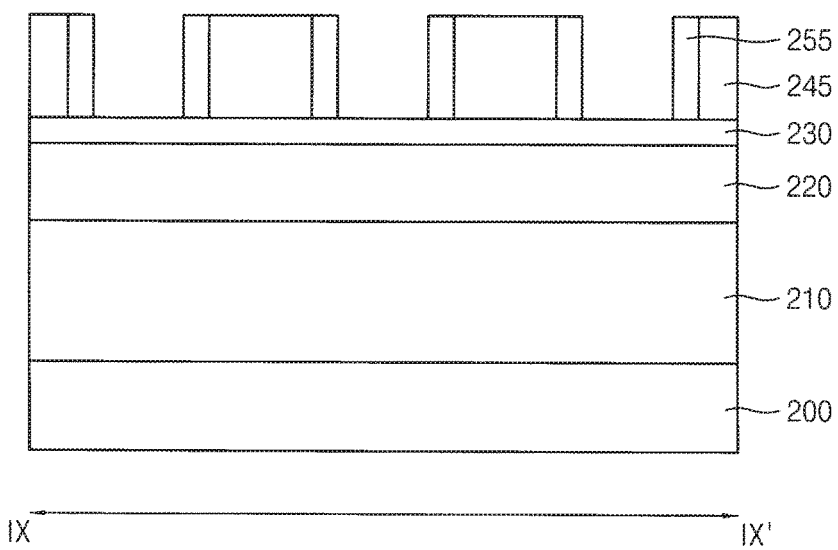

Referring to FIGS. 8 and 9, the first spacer layer 250 may be partially removed to form a first spacer 255 on a sidewall of the first sacrificial pattern 245.

In some example embodiments, portions of the first spacer layer 250 on the upper surface of the first sacrificial pattern 245 and the upper surface of the buffer layer 230 may be removed by an etch-back process to form the first spacer 255 on the sidewall of the first sacrificial pattern 245.

Figure 10:
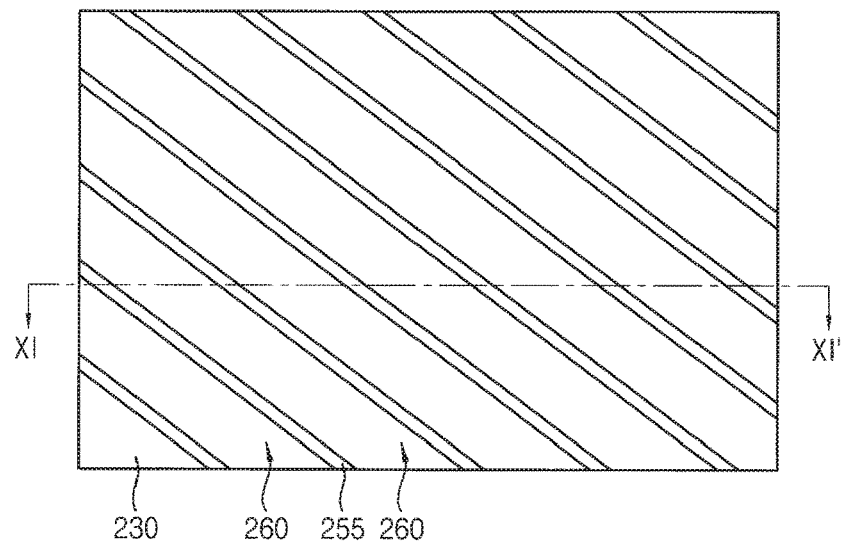
Figure 10:
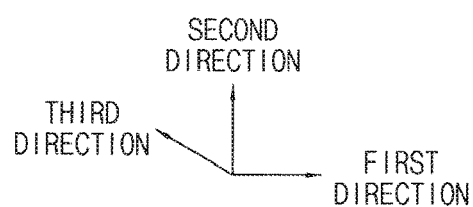
Figure 11:
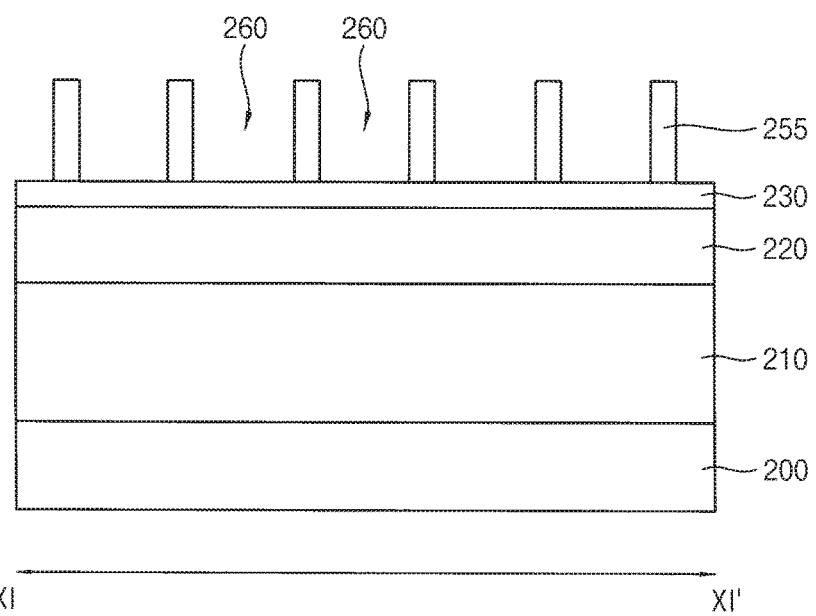

Referring to FIGS. 10 and 11, the first sacrificial patterns 245 may be removed by an ashing process or a stripping process.

By removing the first sacrificial patterns 245, the first spacers 255 extended in the third direction may remain on the upper surface of the buffer layer 230. First openings 260 may be formed between the first spacers 255 by the first double patterning process.

The first openings 260 may be extended in the oblique direction (e.g., the third direction). The first openings 260 may be arranged in the direction substantially perpendicular to the third direction.

Figure 12:
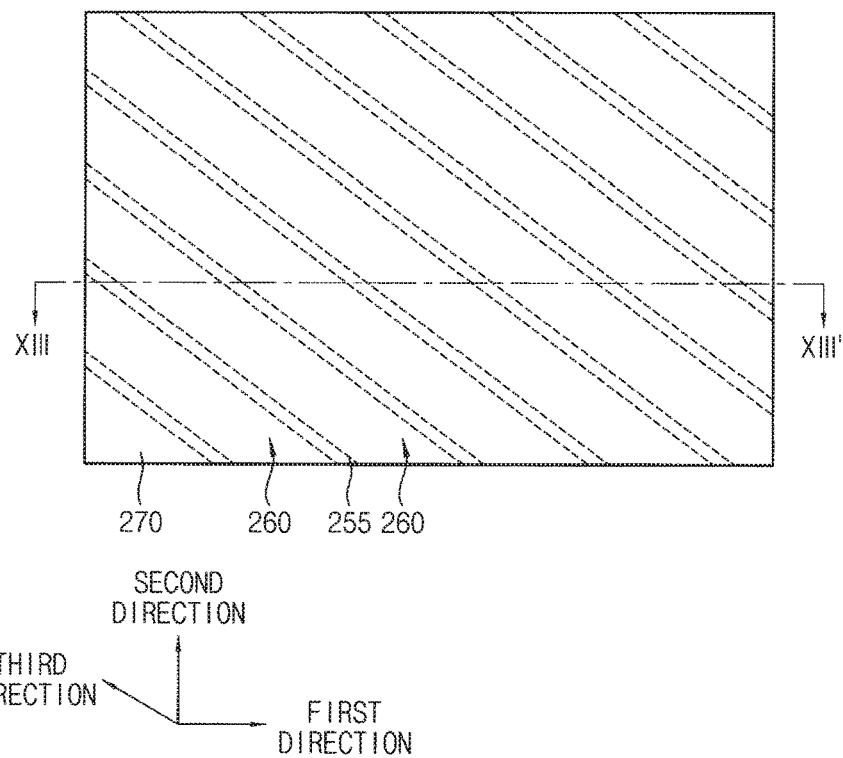
Figure 13:
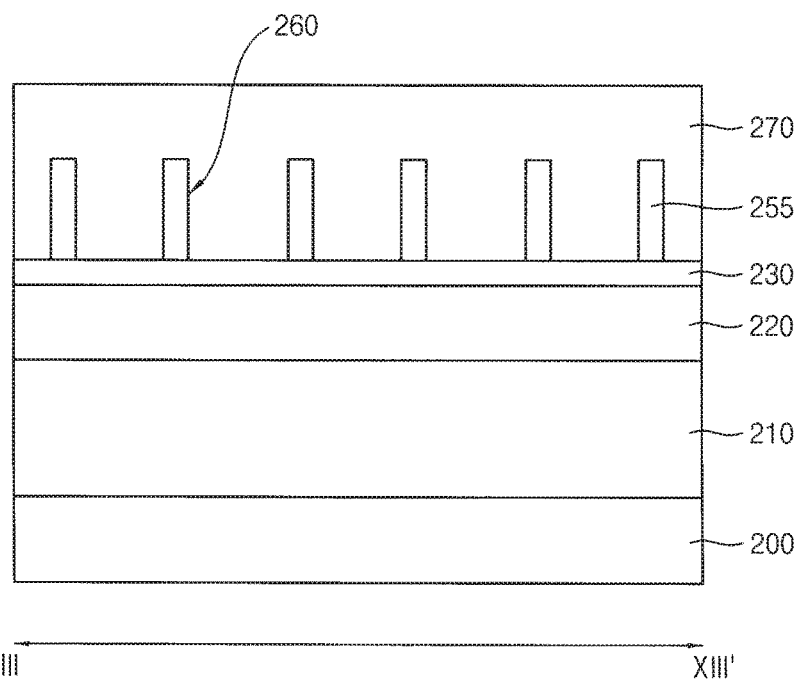

Referring to FIGS. 12 and 13, a second sacrificial layer 270 may be formed on the buffer layer 230 to cover the first spacers 255.

The second sacrificial layer 270 may include a material substantially same as or similar to the material of the first sacrificial layer 240. For example, the second sacrificial layer 270 may be formed by a spin coating process using an SOH. In some example embodiments, the second sacrificial layer 270 may have a thickness for filling up the first openings 260 and covering the first spacers 255. In some example embodiments, the second sacrificial layer 270 may correspond to a target layer of a second double patterning process.

Figure 14:
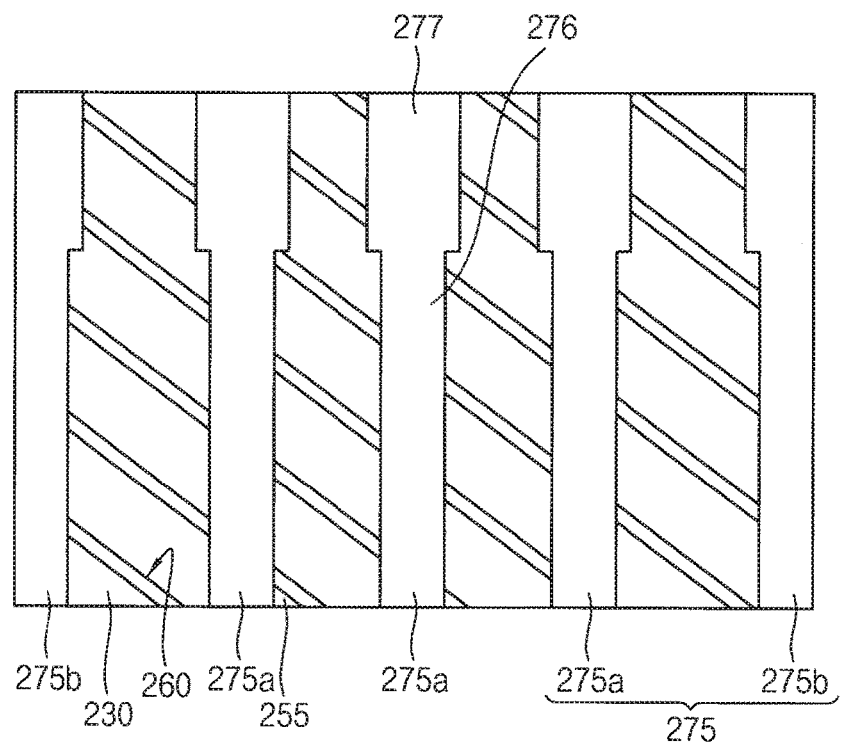

Referring to FIG. 14, the second sacrificial layer 270 may be patterned to form a second sacrificial pattern 275.

In some example embodiments, the second sacrificial pattern 275 may be formed by transcribing the second pattern region 120 of the photomask layout in FIG. 1A or 1B into the second sacrificial layer 270.

For example, a second photoresist film may (not shown) be formed on an upper surface of the second sacrificial layer 270. A second exposure process using the second pattern region 120 of the photomask layout may be performed on the second photoresist film to form a second photoresist pattern. The second sacrificial layer 270 may be patterned using the second photoresist pattern as an etch mask to form the second sacrificial pattern 275. After forming the second sacrificial pattern 275, the second photoresist pattern may then be removed by a strip process.

In some example embodiments, the second sacrificial pattern 275 may intersect with the first sacrificial patterns 255. The second sacrificial pattern 275 may be extended in the second direction. A plurality of the second sacrificial patterns 275 may be arranged in the first direction.

The second sacrificial pattern 275 may include a line portion 276 and a tab portion 277. The line portion 276 may be formed by transcribing the line region 123 of the photomask layout into the second sacrificial layer 270. The tab portion 277 may be formed by transcribing the tab region 125 of the photomask layout into the second sacrificial layer 270.

The tab portion 277 may be connected to an end of the line portion 276. The tab portion 277 may have a width in the first direction greater than a width of the line portion 276. Alternatively, the two tab portions 277 may be connected to both ends of the line portion 276.

In some example embodiments, when the photomask layout in FIG. 1B may be used, a gap between an edge second sacrificial pattern 275 and a central second sacrificial pattern 275 may be wider than a gap between the central second sacrificial patterns 275.

In this case, the second sacrificial pattern 275 may include a cell sacrificial pattern 275a and a dummy sacrificial pattern 275b. The cell sacrificial pattern 275a may be formed by transcribing the cell pattern region 120a of the photomask layout into the second sacrificial layer 270. The dummy sacrificial pattern 275b may be formed by transcribing the dummy pattern region 120b of the photomask layout into the second sacrificial layer 270.

In some example embodiments, the line portions of the cell sacrificial patterns 275a may be arranged in the cell region or a cell block of the semiconductor device. The tab portions 277 of the cell sacrificial patterns 275a and the dummy sacrificial patterns 275b may be arranged in the boundary region or the peripheral region of the cell region or the cell block.

A gap between the dummy sacrificial pattern 275b and the cell sacrificial pattern 275a may be wider than a gap between the cell sacrificial patterns 275a in the first direction. The first spacers 255 and the buffer layer 230 may be partially exposed through spaces between the second sacrificial patterns 275.

Figure 15:
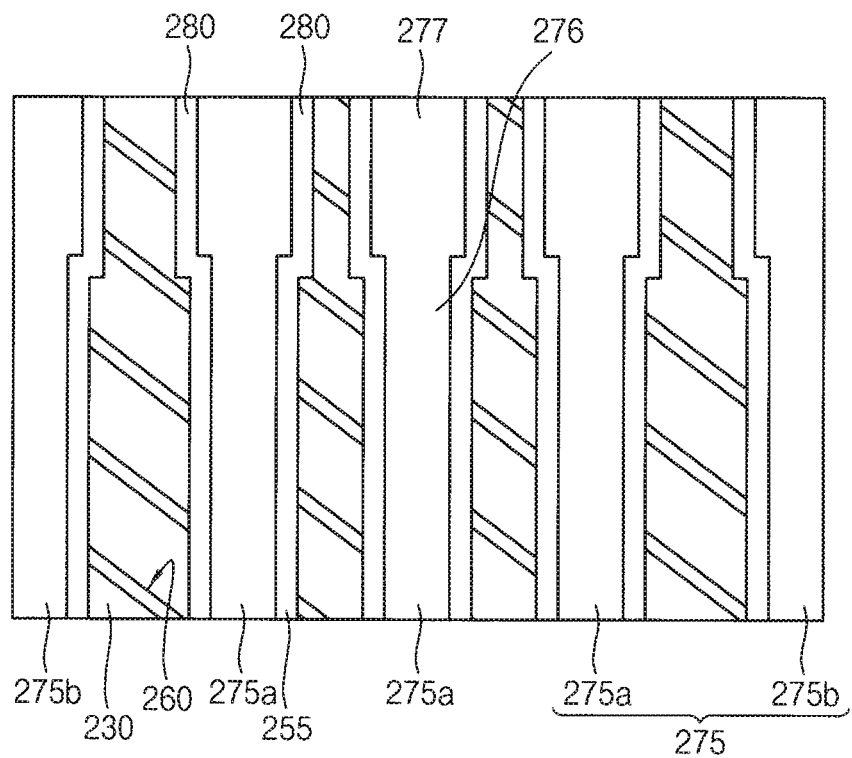

Referring to FIG. 15, a second spacer 280 may be formed on a sidewall of the second sacrificial pattern 275.

The second spacer 280 may be formed by processes substantially same as or similar to those for forming the first spacer 255 with reference to FIGS. 6 to 9. For example, a second spacer layer may be conformally formed on the second sacrificial patterns 275, the buffer layer 230 and the first spacers 255. The second spacer layer may be partially removed by an etch-back process to form the second spacer 280 on the sidewall of the second sacrificial pattern 275.

In some example embodiments, the second spacer layer may include a material different from that of the first spacer 255 so as to secure an etching selectivity. The second spacer layer may be formed by an ALD process using silicon nitride.

Figure 16:
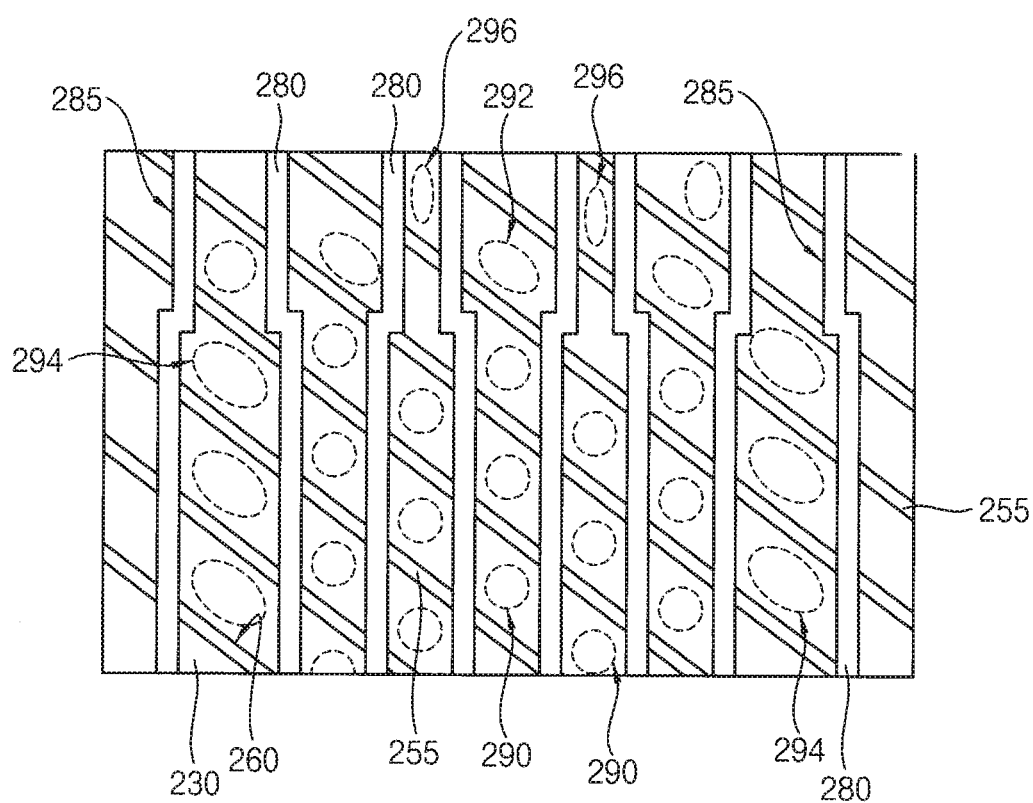
Figure 16:
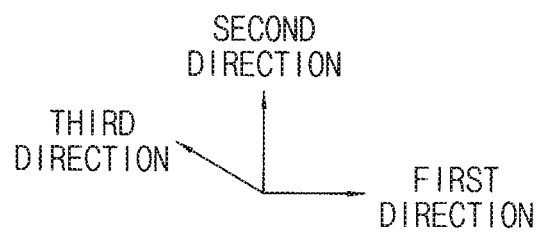

Referring to FIG. 16, the second sacrificial patterns 275 may be removed by an ashing process and/or a stripping process.

By removing the second sacrificial patterns 275, the second spacers 280 may remain. Further, second openings 285 may be defined by spaces between the second spacers 280 in the first direction. The second openings 285 may be extended in the second direction. The second openings 285 may be arranged in the first direction.

In the region where the tab portions 277 are arranged and/or removed, widths of the second openings 285 may alternately increase and decrease in the first direction. That is, in the region where the tab portions 277 are arranged and/or removed, gaps between the second spacers 280 may alternately increase and decrease in the first direction.

The first spacers 255 extended in the third direction and the second spacers 280 extended in the second direction may be intersected with each other on the buffer layer 230 by the first and second double patterning processes. The first spacers 255 and the second spacers 280 may form parallelogram-shaped rooms. The parallelogram-shaped rooms may define hole region represented by dot lines in FIG. 16.

The hole region may include a first hole region 290, a second hole region 292, a third hole region 294 and a fourth hole region 296.

In some example embodiments, the first hole region 290 may be formed in the cell region or the cell block. The second hole region 292 and the third hole region 294 may be formed in the boundary region or the peripheral region of the cell region or the cell block. The fourth hole region 296 may be formed outside the cell region or the cell block.

The second hole region 292 may be defined by a space formed by removing the tab portion 277 of the second sacrificial pattern 275 (See FIGS. 14 and 15). Because the width of the tab portion 277 may be wider than the width of the line portion 276, the second hole region 292 may have a size larger than that of the first hole region 290.

The third hole region 294 may be defined by a space between the cell sacrificial pattern 275a and the dummy sacrificial pattern 275 in FIG. 14, for example, a space corresponding to the second space 130b. Because the gap between the cell sacrificial pattern 275a and the dummy sacrificial pattern 275b is wider than the gap between the cell sacrificial patterns 275b, the third hole region 294 may have a size larger than that of the first hole region 290.

In some example embodiments, the second hole region 292 and the third hole region 294 may function as dummy hole regions.

The fourth hole region 296 may be formed between the second openings 285, which may be positioned between the adjacent tab portions 277. Because the width of the tab portion 277 may be wider than the width of the line portion 276, the second opening 285 between the tab portions 277 may have a width less than that of the second opening 285 between the line portions 276. Further, the second spacer 280 on the sidewall of the tab portion 277 may more reduce the width of the second opening 285.

Therefore, a size of the fourth hole region 296 corresponding to a parasitic hole region outside the cell region or the cell block may decrease.

Figure 17:
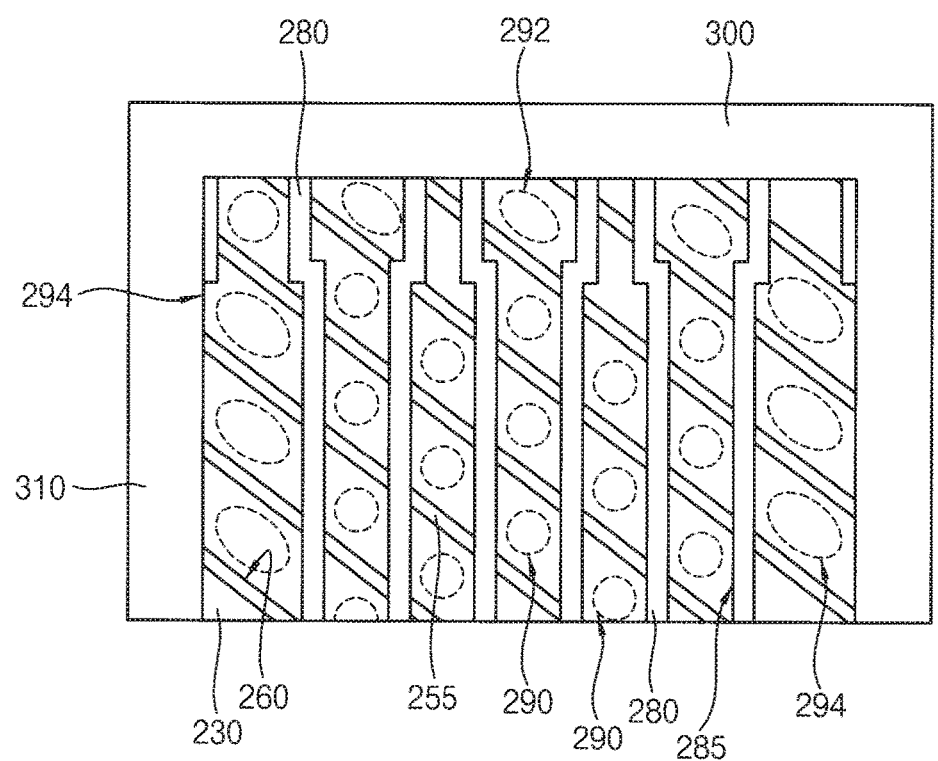
Figure 17:
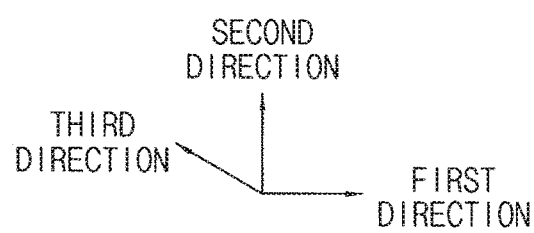

Referring to FIG. 17, a trim pattern may be formed on the buffer layer 230, the first spacers 255 and the second spacers 280. The trim pattern may include a first trim pattern portion 300, which covers or blocks the fourth hole regions 296.

The first trim pattern portion 300 may be formed by an exposure process and developing process using a photoresist material.

In some example embodiments, the first trim pattern portion 300 may be extended in the first direction to fully cover the fourth hole regions 296. The first trim pattern portion 300 may not cover the second hole regions 292. As mentioned above, because the fourth hole region 296 as the parasitic hole region may have the small size by the tab portion 277, the trim pattern 300 may cover only the fourth hole regions, while not covering the second hole region2 292.

In some example embodiments, the trim pattern may include a second trim pattern portion 310 extending in the second direction. The second trim pattern portion 310 may cover a region outside the third hole regions 294.

Figure 18:
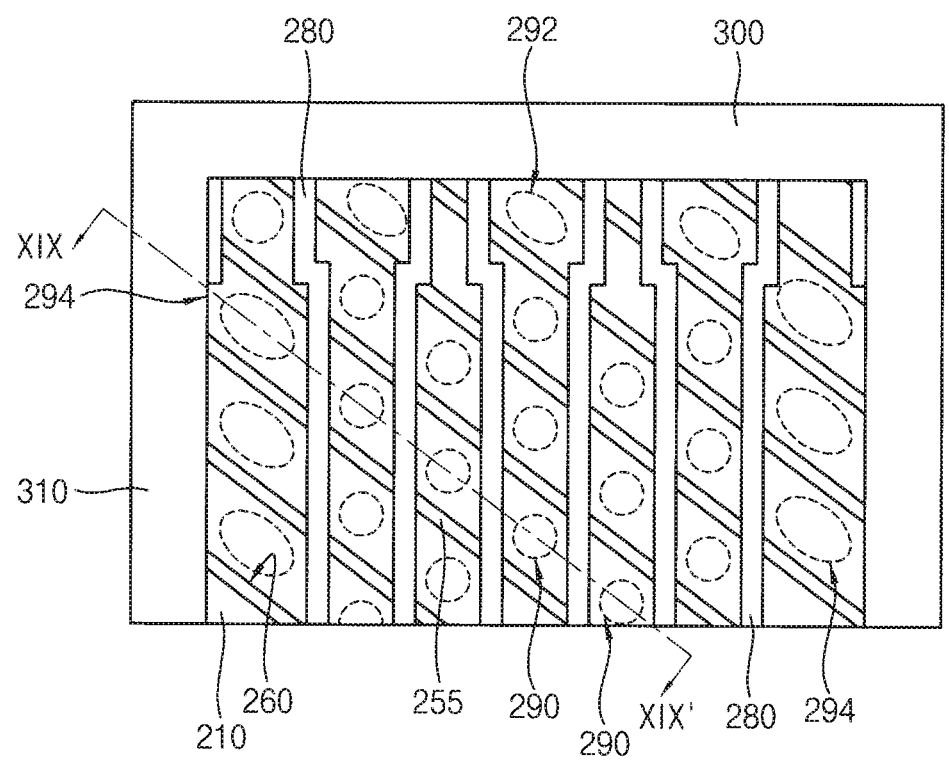
Figure 18:
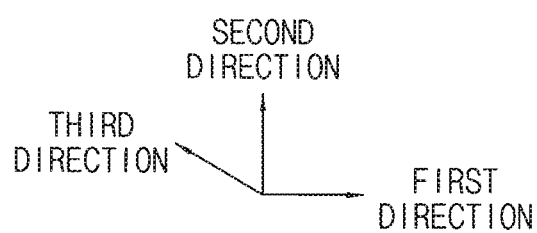
Figure 19:
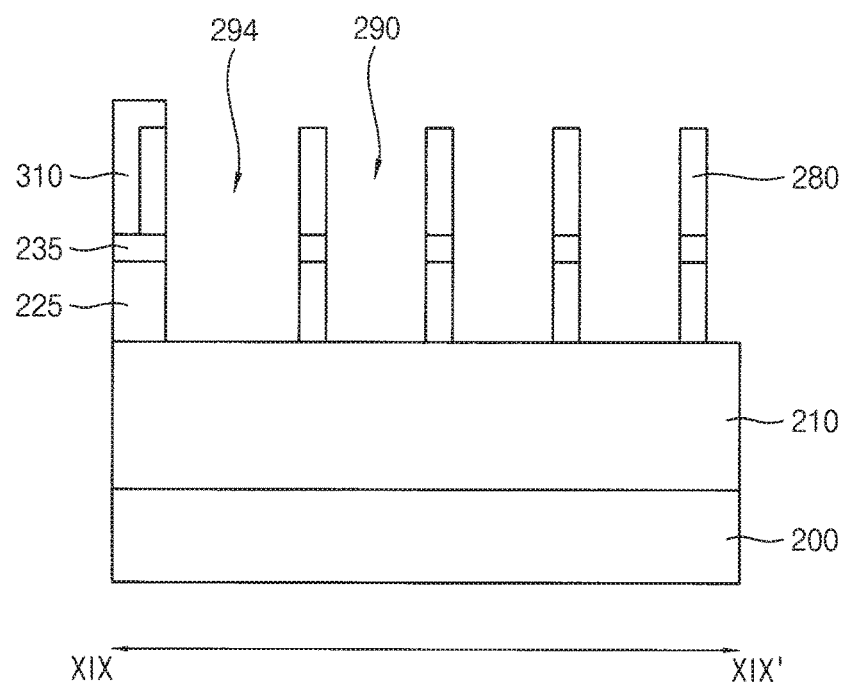

Referring to FIGS. 18 and 19, the buffer layer 230 and the mask layer 220 may be partially etched using the first spacers 255 and the second spacers 280 as an etch mask to form a buffer pattern 235 and a mask layer pattern 225.

Thus, the first hole regions 290, the second hole regions 292 and the third hole regions 294 may be expanded into the mask layer 220 to form the mask pattern 225. Because the first trim pattern portion 300 covers the fourth hole region 296, the fourth hole region 296 may not be transcribed into the mask layer 200.

Referring to FIG. 20, the first and second trim patterns 300 and 310, the first and second spacers 255 and 280 and the buffer layer 230 may be removed by a chemical mechanical polishing (CMP) process. Thus, the mask pattern 225 may remain on the target layer 210.

Referring to FIG. 21, the target layer 210 may be etched using the mask pattern 255 as an etch mask.

The first to third hole regions 290, 292 and 294 may be transcribed into the target layer 210 by the etching process to form contact holes.

The contact holes may include a first contact hole 320, a second contact hole and a third contact hole 330. The first contact hole 320 may be formed by transcribing the first hole region 290 into the target layer 210. The second contact hole may be formed by transcribing the second hole region 292 into the target layer 210. The third contact hole 330 may be formed by transcribing the third hole region 294 into the target layer 210.

In some example embodiments, conductive materials such as a metal, a metal nitride, a metal silicide and/or doped polysilicon may be formed in the contact holes to form contacts. For example, a cell contact in cell region or the cell block of the semiconductor device may be formed in the first contact hole 320.

Dummy contacts in the boundary region or the peripheral region of the cell region or the cell block may be formed in the second contact hole and/or the third contact hole 330. In some example embodiments, the second contact hole and the third contact hole 330 may have an area or a volume greater than those of the first contact hole 320. Thus, the dummy contact may have an area or a volume greater than those of the cell contact.

After forming the contacts, following processes for manufacturing the semiconductor device including, for example, deposition processes and/or etching processes may be performed on the cell region or the cell block. The dummy contacts may function as a buffer to absorb loads or stresses caused by the processes.

After forming the contact holes or the contacts, the mask pattern 225 may be removed by an ashing process and/or a stripping process.

Figure 22:
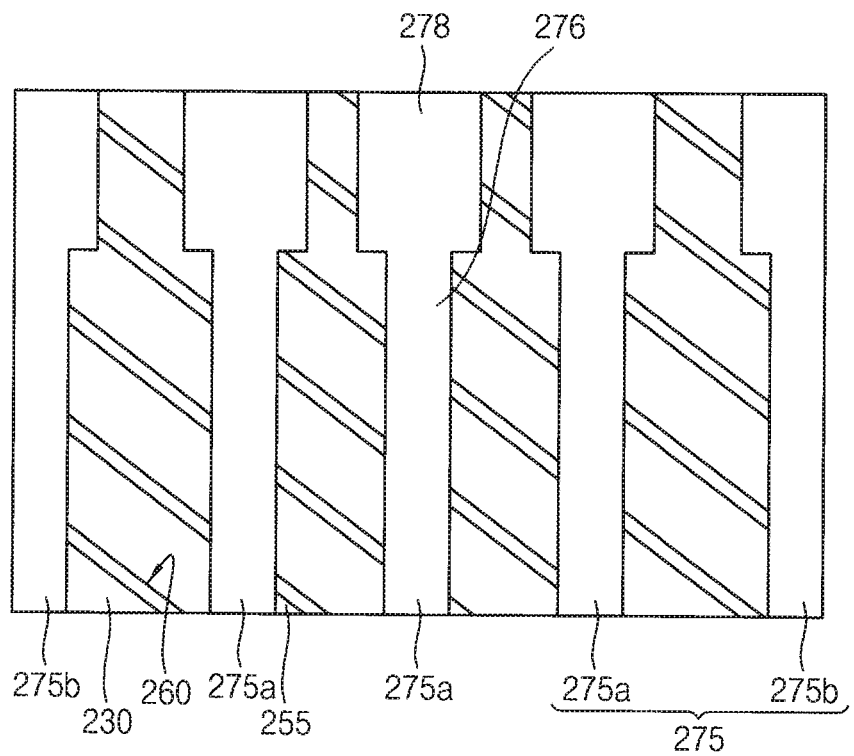
Figure 23:
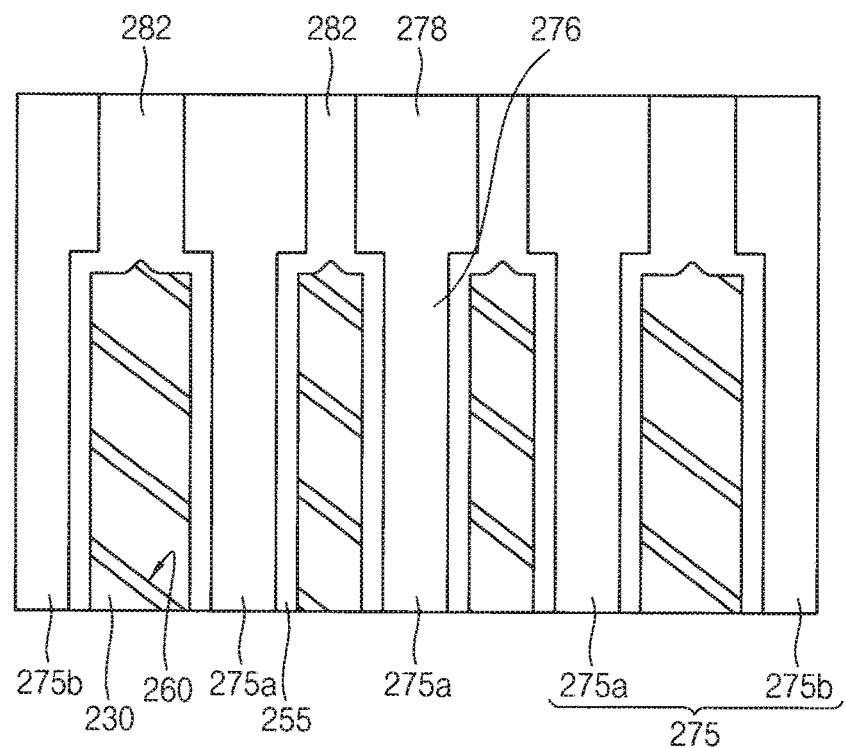
Figure 23:
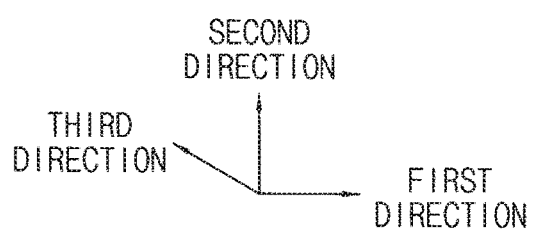
Figure 24:
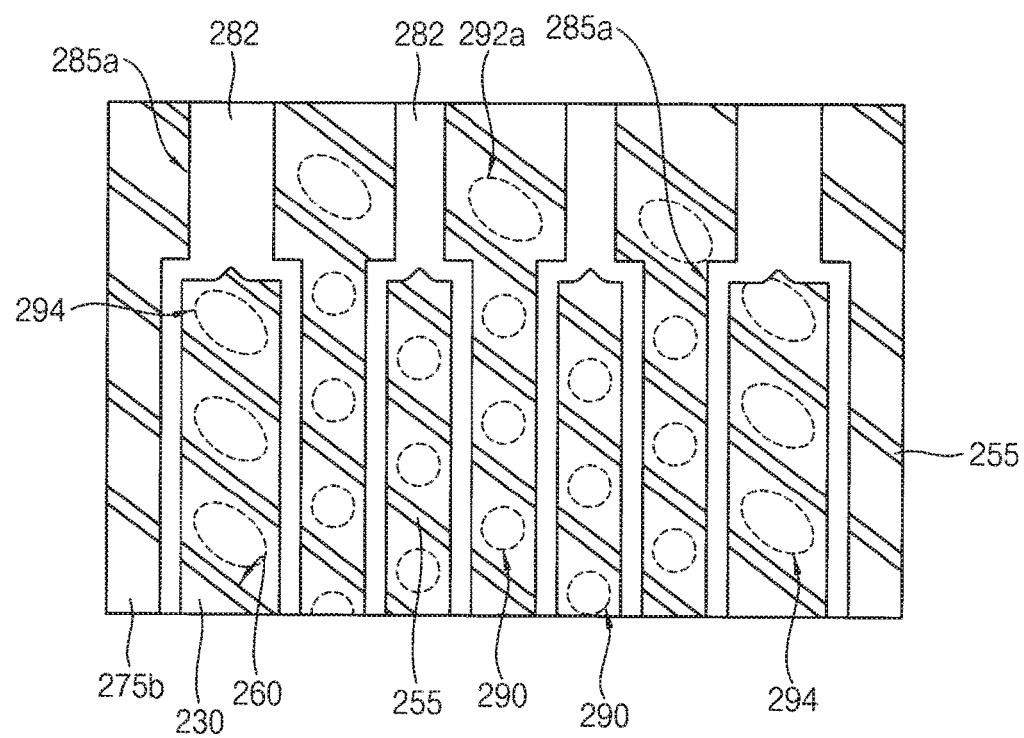
Figure 24:
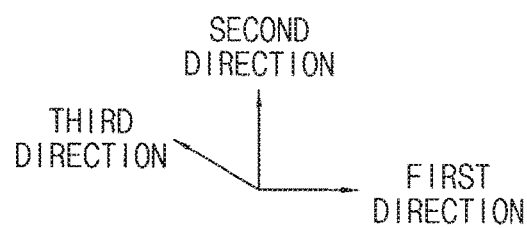

FIGS. 22 to 24 are plan views illustrating a method of forming fine patterns in accordance with an example embodiment.

Any further illustrations with respect to processes substantially the same as those illustrated with reference to FIGS. 2 to 21 may be omitted herein for brevity.

Referring to FIG. 21, the processes substantially the same as those illustrated with reference to FIGS. 2 to 14 may be performed.

In some example embodiments, first spacers 255 may be formed on the buffer layer 230. The first spacers 255 may be extended in the third direction. Second sacrificial patterns 275 may be formed on the first spacers 255 and the buffer layer 230. The second sacrificial patterns 275 may be extended in the second direction.

The second sacrificial pattern 275 may include a line portion 276 and a tab portion 278. The tab region 278 may have a width in the first direction greater than a width of the line portion 278 in the first direction.

Because the width of the tab portion 278 is greater that the width of the line portion 278, the space between the tab portions 278 may decrease compared to the space between the tab portion 277 in FIG. 14.

In some example embodiments, the second sacrificial pattern 275 may include a cell sacrificial pattern 275a and a dummy sacrificial pattern 275b. A gap between the dummy sacrificial pattern 275b and the cell sacrificial pattern 275a may be wider than a gap between the cell sacrificial patterns 275a.

Referring to FIG. 23, second spacers 282 may be formed on sidewalls of the second sacrificial patterns 275 by processes substantially similar to those illustrated with reference to FIG. 15.

In some example embodiments, the second spaces 282 may fully fill up the spaces between the tab portions 278.

Referring to FIG. 24, as mentioned with reference to FIG. 16, the second sacrificial patterns 275 may be removed to form hole regions defined by the first and second spacers 255 and 282 intersecting with each other.

For example, a first hole region 290 may be formed in the cell region or the cell block of the semiconductor device. A second hole region 292a and a third hole region 294 provided as dummy hole regions may be formed in the boundary region or the peripheral region of the cell region or the cell block.

Because the space between the tab portion 278 is fully filled with the second spacer 282, the fourth hole region 296 in FIG. 16 may not be formed. Thus, the process for forming the first trim pattern portion 300 (which may block the parasitic hole region) as illustrated in FIG. 17 may be omitted herein.

Processes substantially same as or similar to those illustrated with reference to FIGS. 18 to 21 may be performed to transcribe the hole regions into the target layer, thereby forming contact holes.

Figure 25:
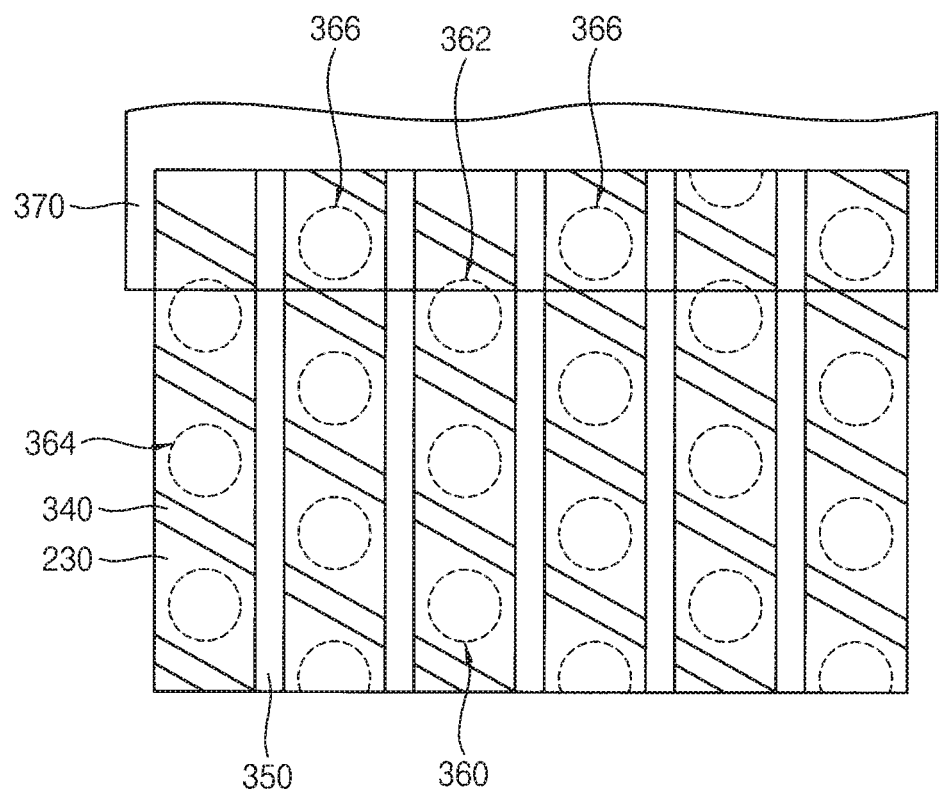
Figure 25:
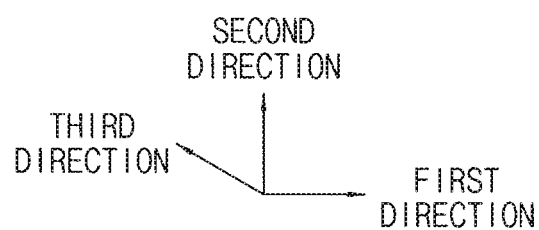
Figure 26:
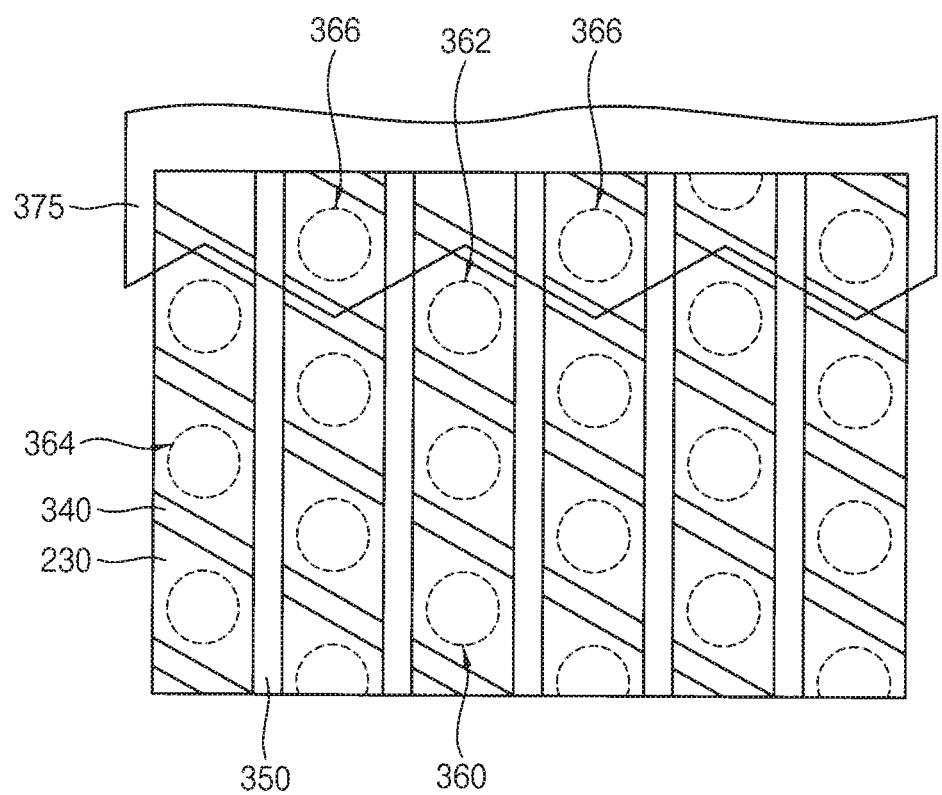
Figure 26:
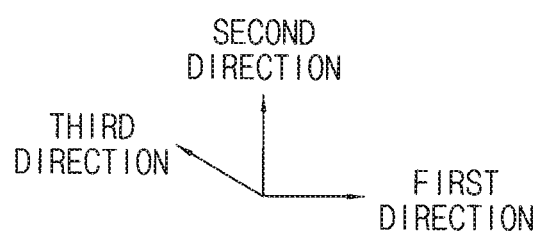

FIGS. 25 and 26 are plan views illustrating methods of forming fine patterns in accordance with some comparative examples.

Any further illustrations with respect to processes substantially the same as those illustrated with reference to FIGS. 2 to 21 or FIGS. 22 to 24 may be omitted herein for brevity.

Referring to FIG. 25, a second sacrificial pattern extended in the second direction may include only a line portion having a uniform width. The second sacrificial pattern may not include a tab portion. A plurality of the second sacrificial patterns may be arranged spaced apart from each other by a uniform interval.

Hole regions may be formed at intersected regions between first spacers 340 and second spacers 350. The hole regions may have substantially a same size. For example, a first hole region 360, a second hole region 362, a third hole region 364 and a fourth hole region 366 may have substantially the same size.

A first trim pattern 370 may block the fourth hole regions 366 as parasitic hole regions outside the cell region. According to Comparative Examples, the first to fourth hole regions 360, 362, 364 and 366 may have the same size. Further, the first to fourth hole regions 360, 362, 364 and 366 may be arranged in a honeycomb shape. Therefore, the first trim pattern 370 may partially block the second hole regions 362 as well as the fourth hole regions 366.

Further, because the sizes of the second hole region 362 and the third hole region 364 are substantially the same as the size of the first hole region 360, forming a dummy contact having a sufficient volume and/or an area may be challenging.

Referring to FIG. 26, in order to block only the fourth hole regions 366, a first trim pattern 375 may have a wavy shape. However, in order to form the first trim pattern 375, an exposure apparatus or a light source having a high resolution may be desired. Further, a cost of a trim process may be substantially increased.

In contrast, according to some example embodiments, as shown in FIG. 14, the second sacrificial pattern 275 may include the tab portion 277 to reduce the size of the undesired parasitic hole region or remove the undesired parasitic hole region. Therefore, the trim process for blocking the parasitic hole may be readily performed. In some example embodiments, the trim process may be omitted.

Further, the gap between the dummy sacrificial pattern 275b and the cell sacrificial pattern 275a may increase so that the size of the dummy hole region may also be increased. Thus, the dummy contact for reducing the loads or the stresses may have the increased volume.

FIGS. 27 to 37 are plan views and cross-sectional views illustrating a method of manufacturing semiconductor devices in accordance with an example embodiment.

Figure 27:
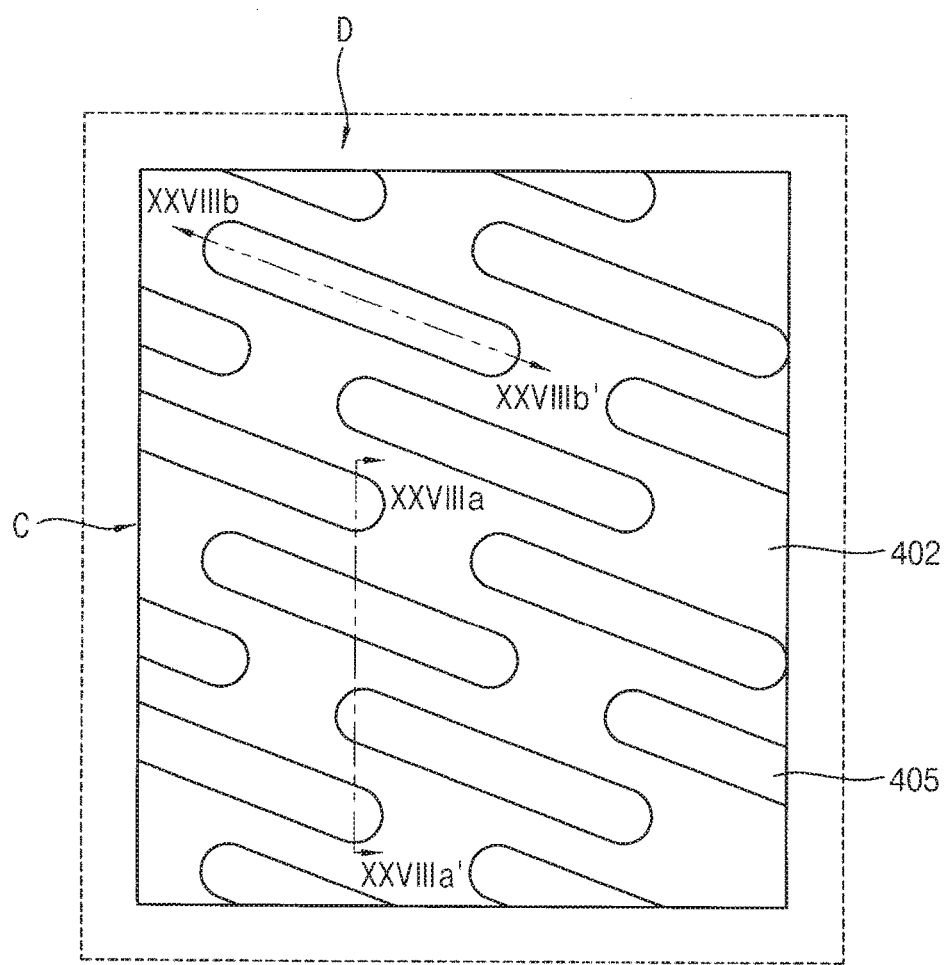
Figure 27:
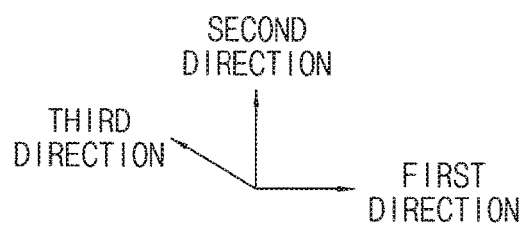
Figure 28:
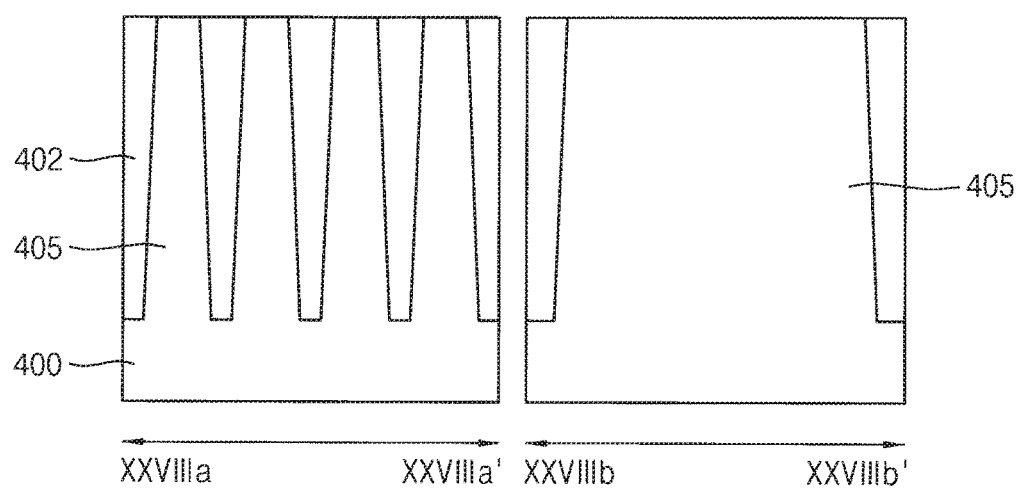
Figure 29:
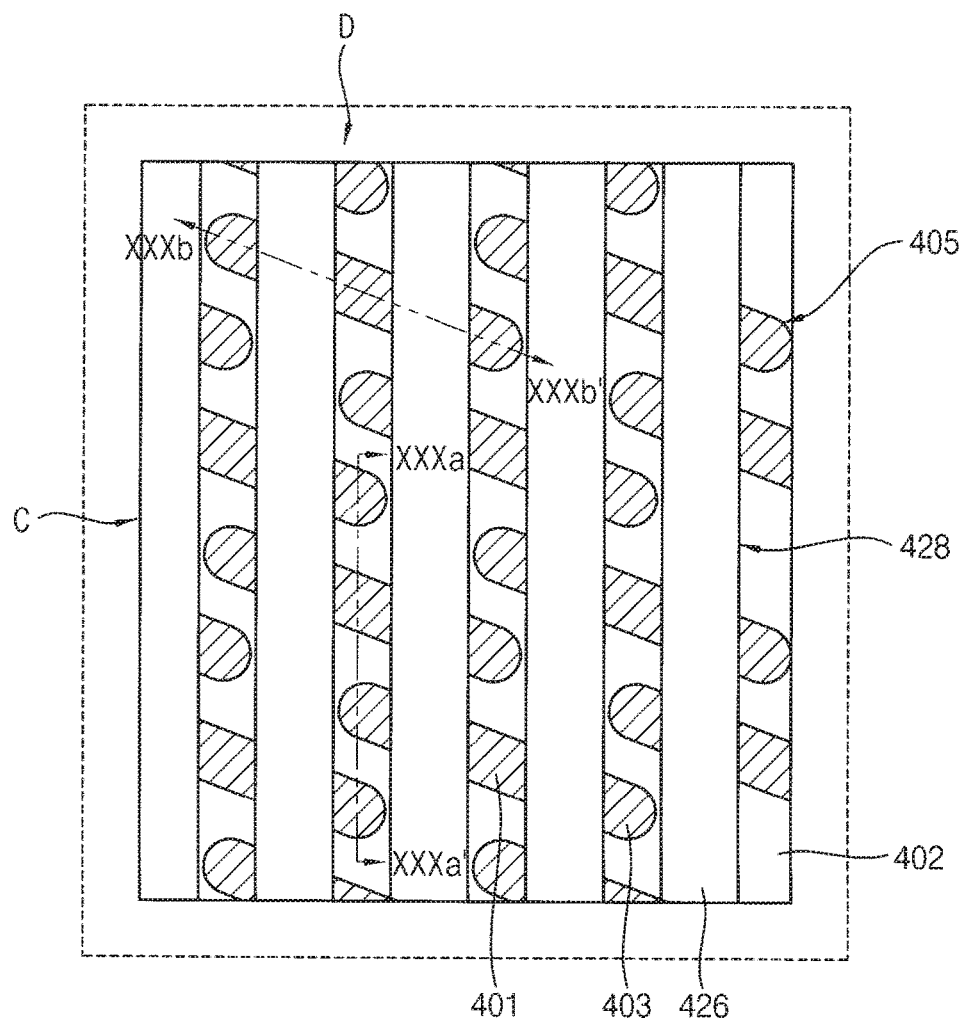
Figure 29:
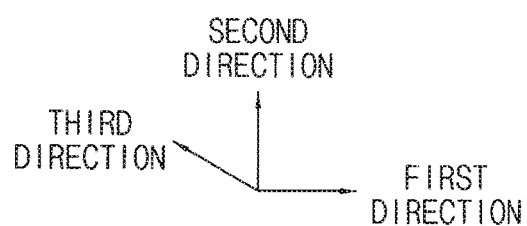
Figure 30:
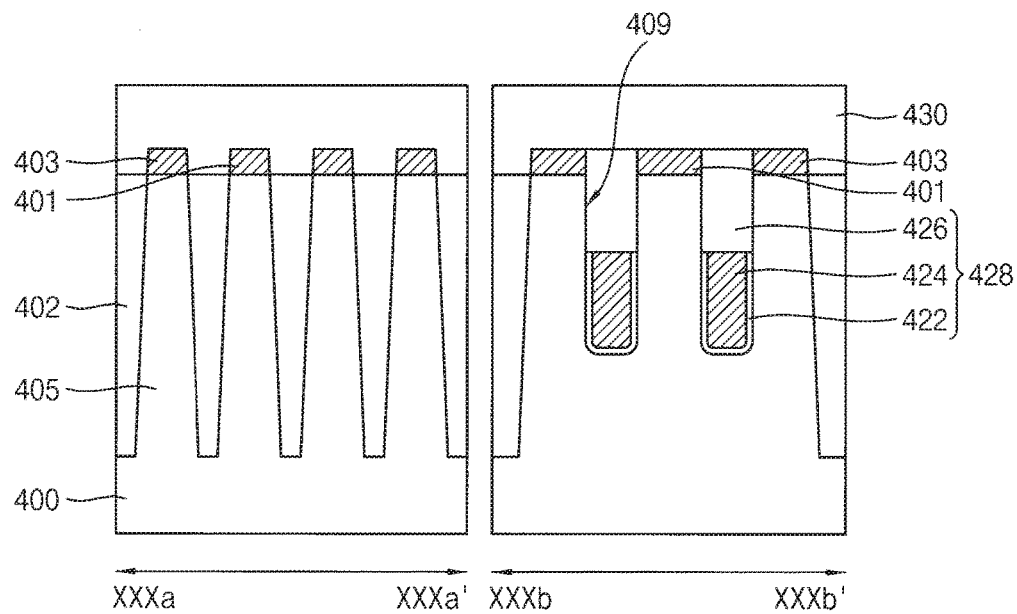
Figure 31:
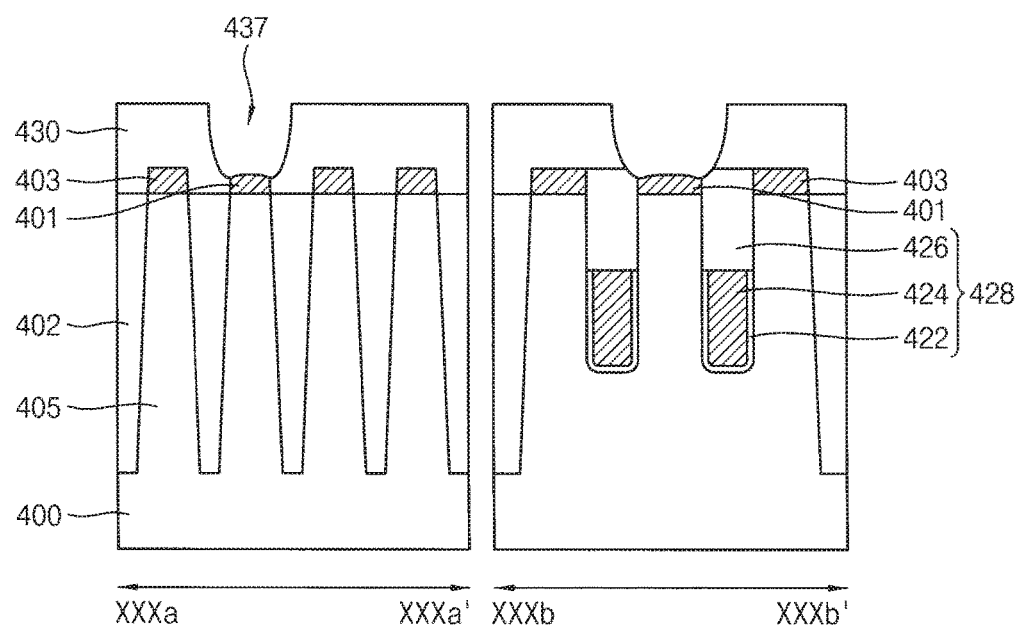
Figure 32:
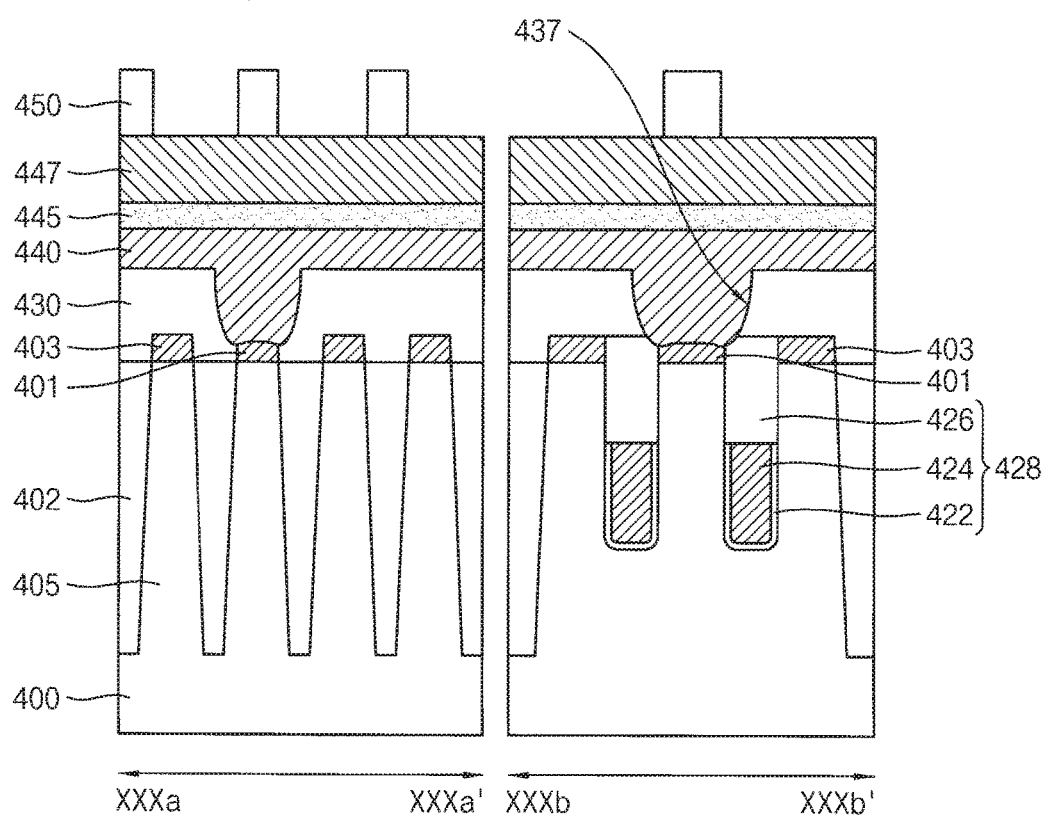
Figure 33:
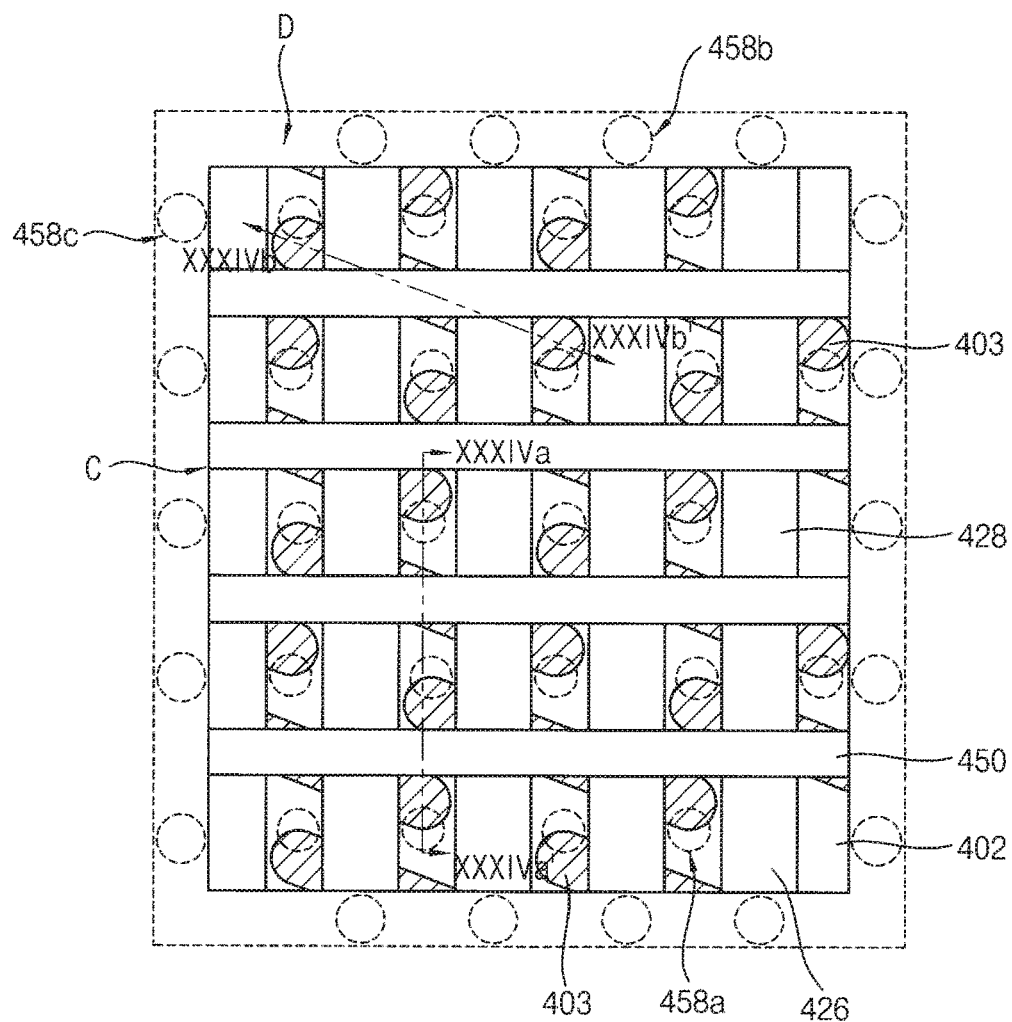
Figure 33:
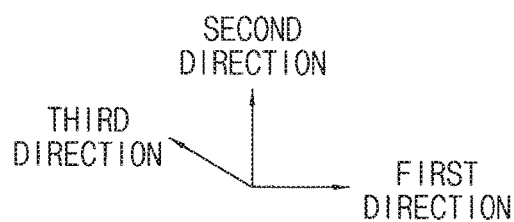

FIGS. 27, 29, and 33 are plan views illustrating the methods of manufacturing the semiconductor devices. FIG. 28 is a cross-sectional views taken along lines XXVIIIa-XXVIIIa' and XXVIIIb-XXVIIIb' in FIG. 27. FIGS. 30 to 32 are cross-sectional views taken along lines XXXa-XXXa' and XXXb-XXXb' in FIG. 29. FIGS. 34 to 37 are cross-sectional views taken along lines XXXIVa-XXXIVa' and XXXIVb-XXXIVb' in FIG. 33.

For example, FIGS. 27 to 37 show methods of manufacturing a DRAM device including a buried cell array transistor (BCAT). Any further illustrations with respect to processes substantially the same as those illustrated with reference to FIGS. 2 to 21 or FIGS. 22 to 24 may be omitted herein for brevity.

Referring to FIGS. 27 and 28, an isolation layer 402 may be formed on an upper surface of a substrate 400 to define a pattern of active regions 405.

In some example embodiments, the substrate 400 may include a semiconductor substrate such as a silicon substrate, a germanium substrate, a silicon-germanium substrate, a silicon-on-insulator (SOI) substrate, a germanium-on-insulator (GOI) substrate, etc. The substrate 400 may include an III-V compound such as InP, GaP, GaAs, GaSb, etc. Although not depicted in drawings, a circuit structure such as a gate structure, impurity regions, a wiring, a plug, etc., may be formed over the substrate 400.

The substrate 400 or the semiconductor device may include a cell region C and a dummy region D. For example, memory cells may be formed in the cell region C to define a cell block. The dummy region D may be defined by a peripheral region configured to surround the cell region C.

The isolation layer 402 and the active pattern 405 may be formed by a shallow trench isolation (STI) process. For example, an upper portion of the substrate 400 may be removed by an isotropic etching process to form an isolating trench. An isolation layer including silicon oxide may be formed on the substrate 400 to fill up the isolating trench. The isolation layer may be planarized by a CMP process until an upper surface of the active pattern 405 may be exposed to form the isolation layer 402.

By forming the isolation layer 402, the active patterns 405 may be spaced apart from each other. As shown in FIG. 27, the active patterns 405 may be extended in the oblique direction, i.e., the third direction. The active patterns 405 may be arranged in the first direction and the second direction.

Referring to FIGS. 29 and 30, gate structures 428 may be formed in upper portions of the active patterns 405 and the isolation layer 402.

In some example embodiments, the upper portions of the active patterns 405 and the isolation layer 402 may be etched to form gate trenches 409. The gate trenches 409 may be extended in the second direction. The gate trenches 409 may be arranged in the first direction. For example, the two gate trenches 409 may be formed in one active pattern 405.

A gate insulating layer may be formed on a surface of the active patterns 405 exposed through the gate trenches 409. The gate insulating layer may be silicon oxide or metal oxide, which is formed by, for example, a thermal oxidation process or a CVD process using.

A gate conductive layer may be formed on the gate insulating layer to fill up the gate trench. The gate conductive layer may be planarized by a CMP process until the upper surface of the active pattern 405 may be exposed. The gate insulating layer and the gate conductive layer in the gate trench 409 may be partially removed by an etch-back process to form a gate insulating pattern 422 and a gate electrode 424 in the gate trench 409.

The gate conductive layer may be formed by an ALD process, a sputtering process, etc., using metal or metal/nitride.

A mask layer may be formed on the gate insulating pattern 422 and the gate electrode 424 to fill up the gate trench 409. The mask layer may be planarized until the upper surface of the active pattern 405 may be exposed to form a gate mask 426. The mask layer may be formed by a CVD process using silicon nitride.

As a result, the gate structure 428 may be formed in the gate trench 409. The gate structure 428 may include the gate insulating pattern 422, the gate electrode 424 and the gate mask 426 that are sequentially stacked.

According to the arrangement of the gate trenches 409, the gate structure 428 may be extended in the second direction. The gate structures 428 may be arranged in the first direction. The gate structure 428 may be buried in the active pattern 405. The upper area of the active region 405 may be divided by the gate structures 428 into a central portion between two adjacent gate structures 428 and an edge portion arranged outside the two adjacent gate structures 428.

An ion implantation process may be performed on the upper portion of the active pattern 405 adjacent to the gate structures 428 to form a first impurity region 401 and a second impurity region 403. The first impurity region 401 may be formed in the central portion of the active pattern 405. The second impurity region 403 may be formed in the edge portion of the active pattern 405. The first and second impurity regions 401 and 403 may be provided as source/drain regions of the semiconductor device.

In some example embodiments, as shown in FIG. 30, the upper portion of the isolation layer 402 may be partially removed by an etch-back process to expose the upper portion of the active pattern 405. An ion implantation process may be performed on the exposed upper portion of the active pattern 405 to form impurity regions 401 and 403.

The BCAT structure may be defined by the first and second impurity regions 401 and 403 and the gate structures 428. A first insulating interlayer 430 may be formed on the active patterns 405 and the isolation layer 402 to cover the BCAT structure. The first insulating interlayer 430 may be formed by a CVD process using silicon oxide (e.g., TEOS).

Referring to FIG. 31, the first insulating interlayer 430 may be partially etched to form a groove 437 configured to expose the first impurity regions 401. The groove 437 may be extended in the first direction in FIG. 27 or FIG. 29. A plurality of the grooves 437 may be arranged in the second direction.

Referring to FIG. 32, a first conductive layer 440 may be formed on the first insulating interlayer 430 to fill up the groove 437. A barrier conductive layer 445 and a second conductive layer 447 may be sequentially formed on the first conductive layer 440. A mask pattern 450 may be formed on the second conductive layer 447.

For example, the first conductive layer 440 may include doped polysilicon. The barrier conductive layer 445 may include, for example, metal nitride or metal silicide nitride. The second conductive layer 447 may include, for example, a metal. The first conductive layer 440, the barrier conductive layer 445 and the second conductive layer 447 may be formed by, for example, a sputtering process, a PVD process, or an ALD process.

The mask pattern 450 may include silicon nitride. The mask pattern 405 may have a linear shape extended in the first direction. The mask pattern 450 may have a width in the second direction less than a width of the groove 437.

Figure 34:
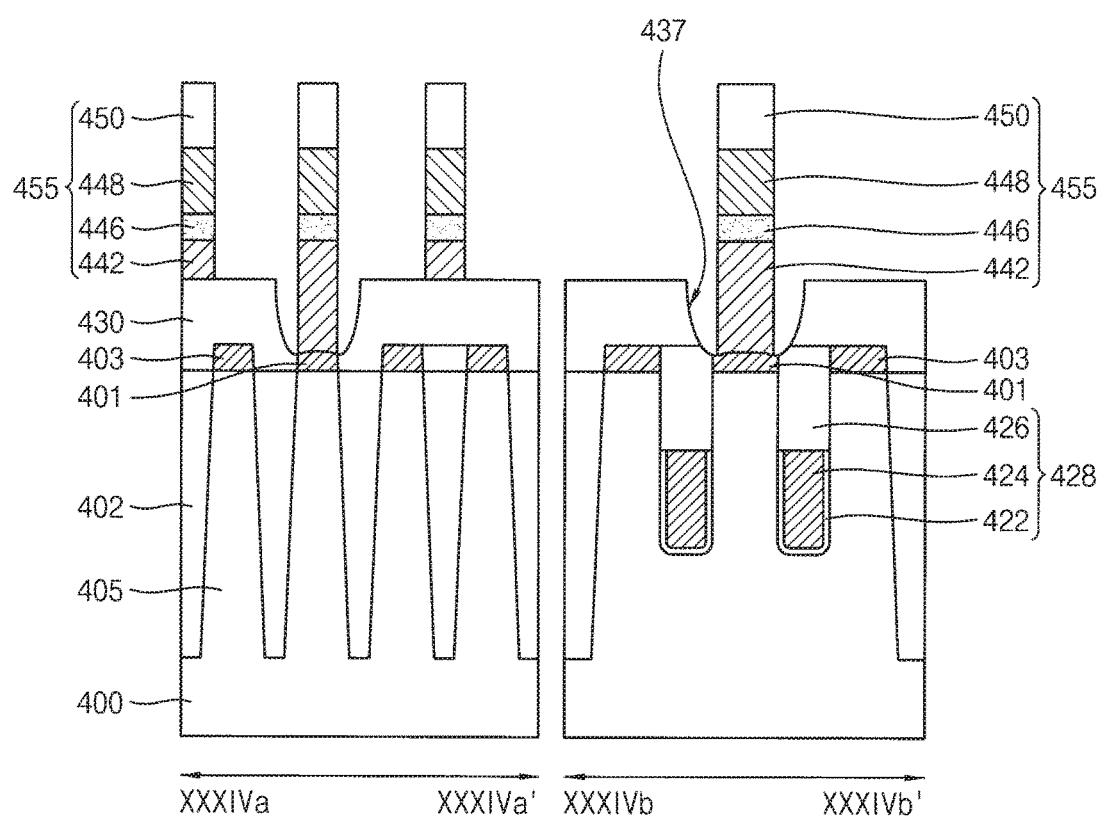

Referring to FIGS. 33 and 34, the second conductive layer 447, the barrier conductive layer 445 and the first conductive layer 440 may be etched using the mask pattern 450 as an etch mask to form a first conductive pattern 442, a barrier conductive pattern 446 and a second conductive pattern 448, which are sequentially stacked on the first impurity region 401. In FIG. 33, the first insulating interlayer 430 is omitted for conveniences of illustration.

As a result, a conductive line structure 455 may be formed on the first impurity region 401. The conductive line structure 455 may be extended in the first direction. The conductive line structure 455 may include the first conductive pattern 442, the barrier conductive pattern 446, the second conductive pattern 448 and the mask pattern 450. The conductive line structure 455 may be provided as a bit line.

In some example embodiments, the conductive line structure 455 may have a width less than the width of the groove 437. Thus, a sidewall of the conductive line structure 455 may be spaced apart from a sidewall of the groove 437.

As shown in FIG. 33, first hole regions 458a may be formed by a space defined by the conductive line structure 455 and the gate structure 428 intersecting with each other when viewed in a plan view. The first hole regions 458a may at least partially overlap with the second impurity regions 403. The first hole regions 458a may be defined in the cell region C. Second hole regions 458b and third hole regions 458c may be defined in the dummy region D. In some example embodiments, the second hole regions 458b and the third hole regions 458c may have a size larger than that of the first hole regions 458a.

Figure 35:
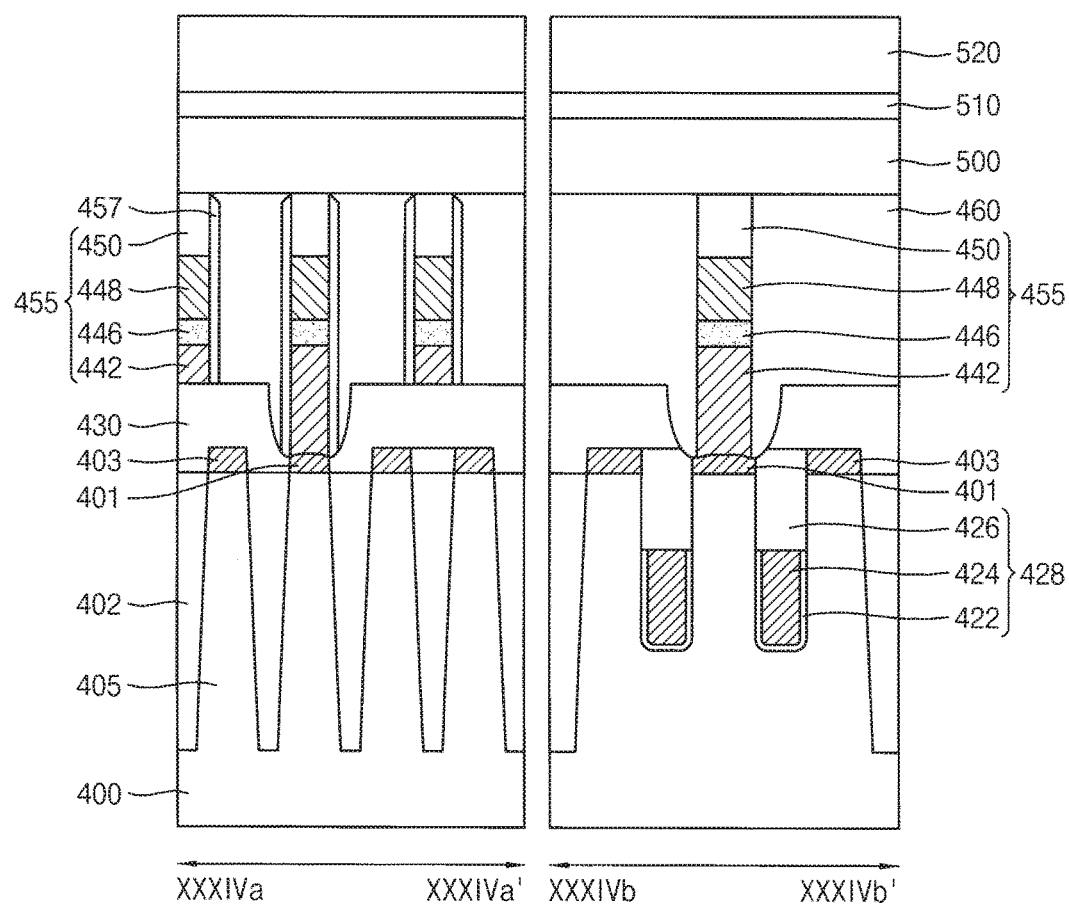

Referring to FIG. 35, a spacer 457 may be formed on the sidewall of the conductive line structure 455. For example, a spacer layer including silicon nitride may be formed on the first insulating interlayer 430 to cover the conductive line structure 455. The spacer layer may be anisotropically etched to form the spacer 457.

A second insulating interlayer 460 may be formed on the first insulating interlayer 430 to cover the conductive line structure 455. The groove 437 may be fully filled with the second insulating interlayer 460. The second insulating interlayer 460 may be formed by a CVD process or a spin coating process using organic oxide such as silicon oxide or polysiloxane. In some example embodiments, the second insulating interlayer 460 may be planarized by a CMP process to expose an upper surface of the mask pattern 450 may be exposed.

As mentioned with reference to FIG. 3, a mask layer 500, a buffer layer 510 and a first sacrificial layer 520 may be sequentially formed on the second insulating interlayer 460 and the mask pattern 450.

Figure 36:
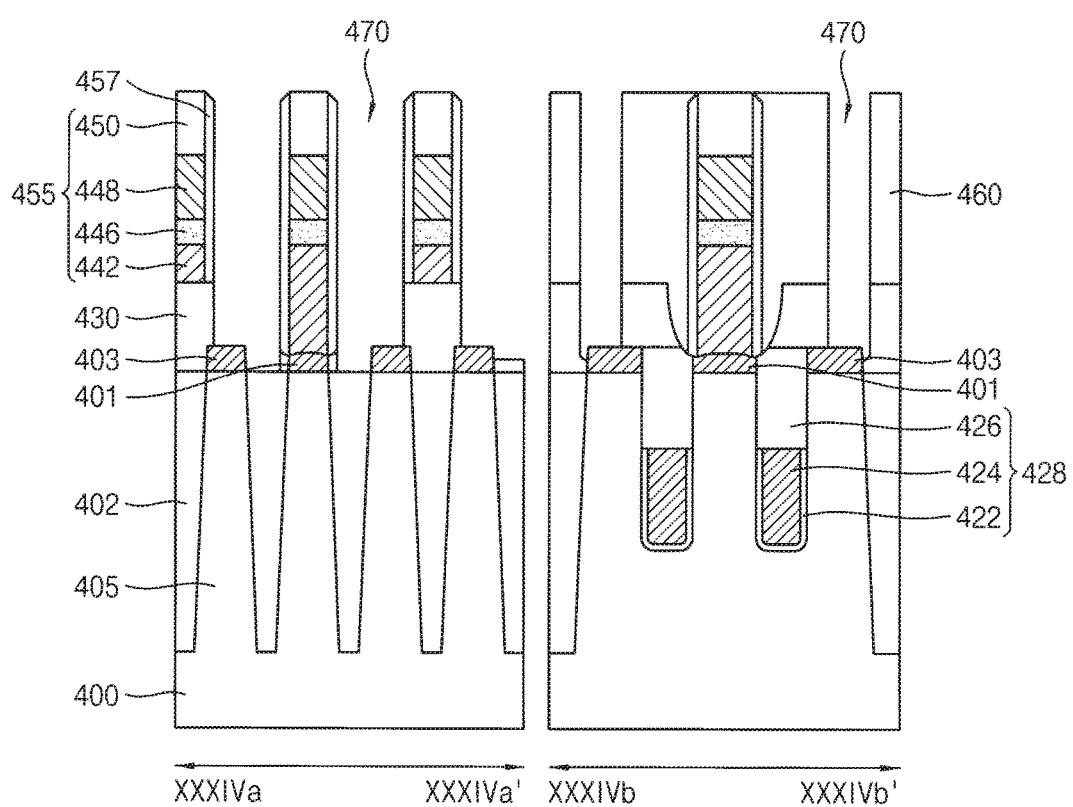

Referring to FIG. 36, processes substantially same as or similar to those illustrated with reference to FIGS. 4 to 21 may be performed.

In some example embodiments, a first double patterning process may be performed on the first sacrificial layer 520 to form first spacers extended in the third direction on the buffer layer 510, as shown in FIGS. 10 and 11.

A second sacrificial layer may be formed on the buffer layer 510 to cover the first spacers. A second double patterning process may be performed on the second sacrificial layer. As mentioned with reference to FIG. 14, the second sacrificial layer may be etched to form second sacrificial patterns extended in the second direction. Each of the second sacrificial patterns may include a line portion and a tab portion. As mentioned with reference to FIGS. 15 and 16, second spacers may be formed on sidewalls of the second sacrificial patterns. The second spacers may be extended in the second direction. The second spacers may be intersected with the first spacers. The second sacrificial patterns may then be removed.

Intersected regions between the first and second spacers may define hole regions arranged in a honeycomb shape (See FIG. 33). The first hole regions 458a may be defined in the cell region C. The second hole regions 458b may be defined in the dummy region D by removing the tab portions. The third hole regions 458c may be defined in the dummy region D at the peripheral region of the cell region C.

As mentioned with reference to FIGS. 16 and 17, the sizes of the second hole regions 458b and the third hole regions 458c may be larger than the size of the first hole region 458a.

In some example embodiments, although parasitic hole regions may be generated outside the dummy region D, the tab portions may decrease the size of the parasitic hole region. As mentioned with reference to FIGS. 22 to 24, the parasitic hole region may not be generated.

Processes substantially same as or similar to those illustrated with reference to FIGS. 18 to 21 may be performed on the second insulating interlayer 460 and/or the first insulating interlayer 430.

In some example embodiments, the buffer layer 510 and the mask layer 500 may be etched through the first to third hole regions 458a, 458b and 458c. The second insulating interlayer 460 and the first insulating interlayer 430 may be etched through the mask pattern to form contact holes 470.

The contact hole 470 may be formed by transcribing the first hole regions 458a into the second insulating interlayer 460 and the first insulating interlayer 430. The contact hole 470 may be configured to partially expose the second impurity region 403.

Although not depicted in FIG. 36, dummy contact holes may be formed by transcribing the second and third hole regions 458b and 458c. The dummy contact holes may have a size larger than that of the contact hole 470.

In some example embodiments, a trim pattern may be formed to block the parasitic hole region. Alternatively, forming the trim pattern may be omitted.

Figure 37:
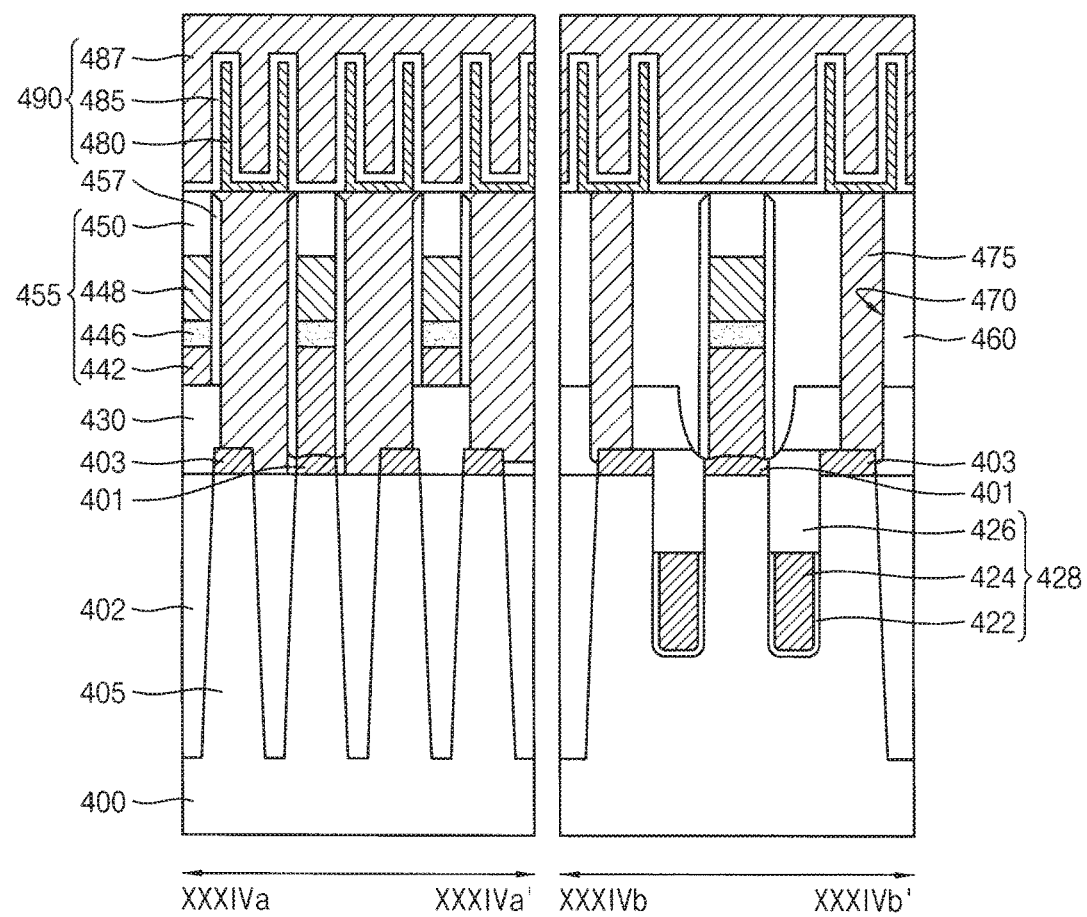

Referring to FIG. 37, a conductive contact 475 may be formed in the contact hole 370. The conductive contact 475 may be configured to be electrically connected with or make contact with the second impurity region 403. A capacitor 490 may be formed on the conductive contact 475. The conductive contact 490 may function as a capacitor contact.

For example, a conductive layer may be formed in the contact holes 470. The conductive layer may be planarized by a CMP process until the upper surface of the mask pattern 450 may be exposed to form the conductive contact 475 in the contact hole 470. The conductive contact 475 may be configured to make contact with the second impurity region 403.

Dummy contacts may be formed in the dummy contact holes together with the conductive contacts 475. The dummy contact may have a volume larger than that of the conductive contact 475. The dummy contact may function as a buffer contact for reducing the stresses concentrated on the cell region C.

The conductive layer may be metal (e.g., copper or tungsten) formed by, for example, a sputtering process, a PVD process, an ALD process, or a CVD process. In some example embodiments, the conductive layer may be formed by, for example, a plating process or an electroless plating process. In some example embodiments, a barrier layer such as titanium nitride, titanium, etc., may be formed on an inner surface of the contact hole 470.

The capacitor 490 may be electrically connected with the conductive contact 475 to complete the DRAM device having the BCAT structure.

For example, an etch stop layer and a mold layer may be sequentially formed on the mask pattern 450, the second insulating interlayer 460 and the conductive contact 475. The mold layer and the etch stop layer may be partially removed to form a capacitor opening exposing the conductive contact 475.

A lower electrode layer may be formed on an inner surface of the capacitor opening and an upper surface of the mold layer. A sacrificial layer may be formed on the lower electrode layer. The sacrificial layer and the lower electrode layer may be planarized until the upper surface of the mold layer may be exposed. The sacrificial layer and the mold layer may be removed to form a lower electrode 480.

A dielectric layer 485 may be formed on the etch stop layer and the lower electrode 480. An upper electrode 487 may be formed on the dielectric layer 485 to form the capacitor 490. The dielectric layer 485 may include silicon oxide or metal oxide having a high dielectric constant. The lower electrode 480 and the upper electrode 487 may include metal or metal nitride such as tungsten, tungsten nitride, titanium, titanium nitride, tantalum, tantalum nitride, ruthenium, ruthenium nitride, etc.

The methods of forming the fine patterns may be applied to form the capacitor contact of the DRAM device having a fine critical dimension. Further, the methods of forming the fine patterns may be applied to form fine structures of semiconductor devices such as a logic device, an SRAM device, a flash memory device, a PRAM device, an MRAM device, an RRAM device, etc.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming fine patterns, the method comprising:
    forming a plurality of first sacrificial patterns on a target layer, the target layer on a substrate;
    forming first spacers on respective sidewalls of the first sacrificial patterns;
    removing the first sacrificial patterns;
    forming a plurality of second sacrificial patterns, the second sacrificial patterns intersecting with the first spacers, each of the second sacrificial patterns including a line portion and a tab portion, and the tab portion having a width wider than the line portion;
    forming second spacers on respective sidewalls of the second sacrificial patterns;
    removing the second sacrificial patterns; and
    etching the target layer through hole regions, the hole regions defined by the first spacers and the second spacers, to expose the substrate.

2. The method of claim 1, wherein the second sacrificial patterns extend in a first direction, and the second sacrificial patterns are arranged in a second direction perpendicular to the first direction, and the first sacrificial patterns extend in a third direction oblique to both the first direction and the second direction.

3. The method of claim 2, wherein the first spacers extend in the third direction, and the second spacers extend in the second direction.

4. The method of claim 2, wherein the tab portion is connected to an end of the line portion along the second direction.

5. The method of claim 4, wherein the hole regions comprise:
    first hole regions defined by the second spacers on a sidewall of the line portion and the first spacers; and
    second hole regions defined by the second spacers on a sidewall of the line portion and the first spacers at spaces, where the tab portions of the second sacrificial patterns are removed.

6. The method of claim 5, wherein each of the second hole regions has a size larger than a size of each of the first hole regions.

7. The method of claim 5, wherein the second sacrificial patterns comprise:
    cell sacrificial patterns; and
    a dummy sacrificial pattern positioned adjacent to one of the cell sacrificial patterns in the first direction.

8. The method of claim 1, wherein forming the second spacers on the sidewalls of the second sacrificial patterns comprises:
    forming a second spacer layer on surfaces of the second sacrificial patterns such that spaces between the tab portions are filled by the second spacer; and
    partially removing the second spacer layer to form the second spacers on the sidewalls of the second sacrificial patterns.

9. The method of claim 1, further comprising:
    forming a mask layer on the target layer prior to the forming first sacrificial patterns; and
    transcribing the hole regions into the mask layer to form a mask pattern.

10. A method of forming fine patterns, the method comprising:
    forming a target layer on a substrate, the substrate having a cell region and a dummy region;
    forming first spacers on the target layer by a first double patterning process, the first spacers extending in a first direction;
    forming second spacers extending in a second direction by a second double patterning process such that the first direction is oblique to the second direction, the second spacers intersect with the first spacers, and gaps between the second spacers alternate between a first gap and a second gap wider than the first gap in the dummy region in the first direction; and etching the target layer through spaces defined by the first spacers and the second spacers to form contact holes.

11. The method of claim 10, wherein the first double patterning process comprises:
   forming a plurality of first sacrificial patterns on the target layer, the first sacrificial patterns extending in the first direction;
   forming the first spacers on sidewalls of the first sacrificial patterns; and
   removing the first sacrificial patterns.

12. The method of claim 11, wherein the second double patterning process comprises:
   forming a plurality of second sacrificial patterns, the second sacrificial patterns intersecting with the first spacers, each of the second sacrificial patterns including a line portion and a tab portion, and the tab portion having a width wider than the line portion;
   forming the second spacers on sidewalls of the second sacrificial patterns; and
   removing the second sacrificial patterns.

13. The method of claim 12, wherein a first set of the spaces defined by the first spacers and the second spacers over the cell region forms cell hole regions, a second set of the spaces defined by the first spacers and the second spacers over the dummy region forms dummy hole regions, and each of the dummy hole regions has a size larger than each of the cell hole regions.

14. The method of claim 13, wherein a parasitic hole region is defined by a space between the tab portions of a neighboring pair of the second sacrificial patterns, and the parasitic hole region has a size smaller than a size of each of the cell hole regions.

15. The method of claim 14, further comprising:
   forming a trim pattern to block the parasitic hole region.

16. A method of forming fine patterns, the method comprising:
   forming an isolation layer on a substrate to define active patterns;
   forming gate structures on the active patterns and the isolation layer;
   forming source/drain regions on the active patterns, the source/drain regions adjacent to the gate structures;
   forming an insulating interlayer on the active patterns and the isolation layer to cover the gate structures and the source/drain regions;
   forming a plurality of first sacrificial patterns on the insulating interlayer;
   forming first spacers on sidewalls of the first sacrificial patterns;
   removing the first sacrificial patterns;
   forming a plurality of second sacrificial patterns, the second sacrificial patterns intersecting with the first spacers, each of the second sacrificial patterns including a line portion and a tab portion, and the tab portion having a width wider than the line portion;
   forming second spacers on sidewalls of the second sacrificial patterns;
   removing the second sacrificial patterns; and
   partially removing the insulating interlayer through hole regions, the hole regions defined by the first spacers and the second spacers, to form contact holes exposing the source/drain regions.

17. The method of claim 16, wherein the second sacrificial patterns extends in a first direction, and the second sacrificial patterns are arranged in a second direction perpendicular to the first direction, the first sacrificial patterns extend in a third direction oblique to both the first direction and the second direction.

18. The method of claim 16, wherein a dummy hole region is defined by a space formed in a space formed by removing the tab portion.

19. The method of claim 18, further comprising:
   etching the insulating interlayer through the dummy hole region to form a dummy contact hole; and
   forming contacts in the contact holes; and
   forming a dummy contact in the dummy contact hole.

20. The method of claim 16, further comprising:
   forming conductive line structures electrically connected to corresponding ones of the source/drain regions, while leaving some of the source/drain regions to be not electrically connected to the conductive line structures,
   wherein the gate structures intersect with the conductive line structures.

* * * * *